United States Patent [19]

Hicks, Jr.

[11] Patent Number: 4,616,898

[45] Date of Patent: Oct. 14, 1986

[54] OPTICAL COMMUNICATION SYSTEMS USING RAMAN REPEATERS AND COMPONENTS THEREFOR

[75] Inventor: John W. Hicks, Jr., Northborough, Mass.

[73] Assignee: Polaroid Corporation, Cambridge, Mass.

[21] Appl. No.: 536,655

[22] Filed: Sep. 28, 1983

Related U.S. Application Data

[63] Continuation-in-part of Ser. No. 403,759, Jul. 30, 1982, abandoned, which is a continuation-in-part of Ser. No. 135,798, Mar. 31, 1980, Pat. No. 4,342,499.

[51] Int. Cl.$^4$ .......................... G02B 6/42; G02B 6/26; G02B 6/28
[52] U.S. Cl. .............. 350/96.15; 350/96.16; 350/96.30; 350/96.32; 350/96.33; 370/1
[58] Field of Search ............... 350/96.15, 96.16, 96.19, 350/96.20, 96.29, 96.30, 96.32, 96.33; 372/6; 370/1, 3, 4; 455/601, 610, 611, 612

[56] References Cited

U.S. PATENT DOCUMENTS

| | | | |
|---|---|---|---|
| 3,705,992 | 12/1972 | Ippen et al. | 372/3 X |
| 3,803,511 | 4/1974 | Thompson | 350/96.15 X |
| 4,039,851 | 8/1977 | Jain et al. | 372/3 X |
| 4,063,106 | 12/1977 | Ashkin et al. | 372/3 X |
| 4,234,970 | 11/1980 | Beasley et al. | 350/96.16 X |
| 4,315,666 | 2/1982 | Hicks, Jr. | 350/96.15 |
| 4,342,499 | 8/1982 | Hicks, Jr. | 350/96.15 |
| 4,354,736 | 10/1982 | Maklad et al. | 350/96.30 X |
| 4,358,851 | 11/1982 | Scifres et al. | 372/6 X |
| 4,368,543 | 1/1983 | Hasegawa | 455/612 |
| 4,401,364 | 8/1983 | Mochizuki | 350/96.16 |
| 4,449,782 | 5/1984 | Korth | 350/96.16 |
| 4,515,431 | 5/1985 | Shaw et al. | 350/96.15 |

FOREIGN PATENT DOCUMENTS

| | | | |
|---|---|---|---|
| 147441 | 4/1981 | German Democratic Rep. | 372/20 |
| 1543035 | 3/1979 | United Kingdom | 350/96.16 |

OTHER PUBLICATIONS

Kawasaki et al., "Bandwidth-Limited Operation of a Mode-Locked Brillouin...", *Appl. Phys. Lett.*, vol. 32, No. 7, Apr. 1978, pp. 429-431.

*Primary Examiner*—William L. Sikes
*Assistant Examiner*—Frank González
*Attorney, Agent, or Firm*—Francis J. Caufield

[57] ABSTRACT

An optical fiber communication system for transmitting information-bearing optical signals over an optical fiber transmission line includes a signal generator coupled to the transmission line for introducing information-bearing optical signals thereonto, preferably as wavelength modulated signals, and one or more optical amplifiers for periodically, collectively amplifying the transmitted signals to overcome the effects of attenuation. Wavelength modulation is achieved by altering the resonant characteristics of an optical resonator, optically coupled to a gain medium so as to provide an output that varies between a first and second wavelength. The optical amplification is achieved by injecting, preferably via lateral optical fiber couplings, pumping beams into the optical fiber so as to effect an increase in the amplitude of the information-bearing signals by stimulated Raman scattering.

97 Claims, 15 Drawing Figures

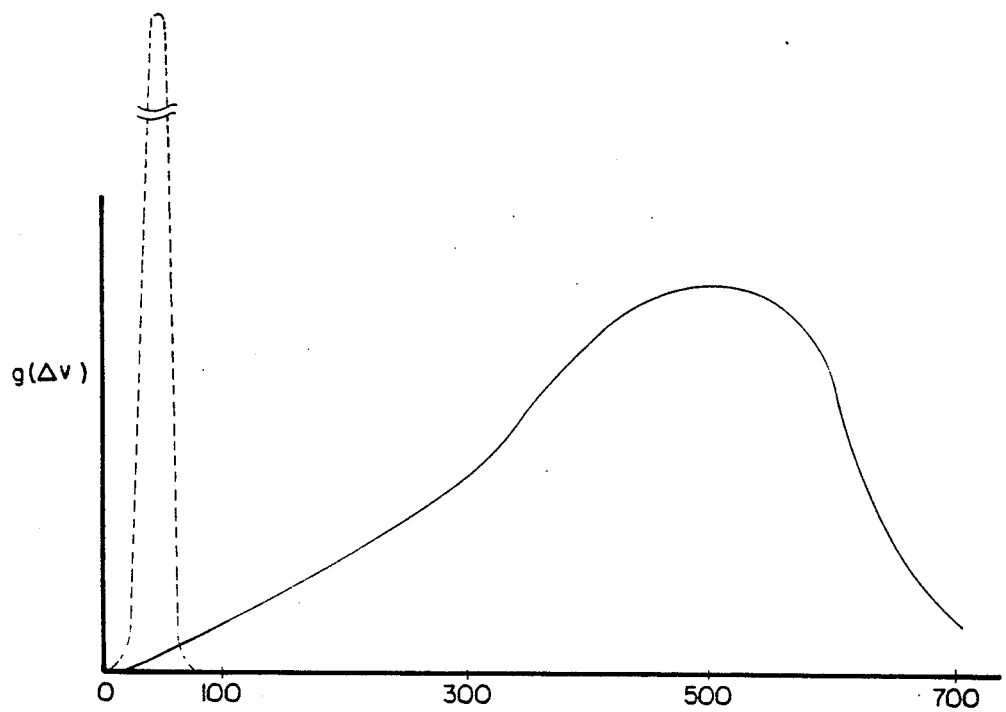
FIG. 2 $\Delta v$, FREQUENCY SHIFT-CM$^{-1}$
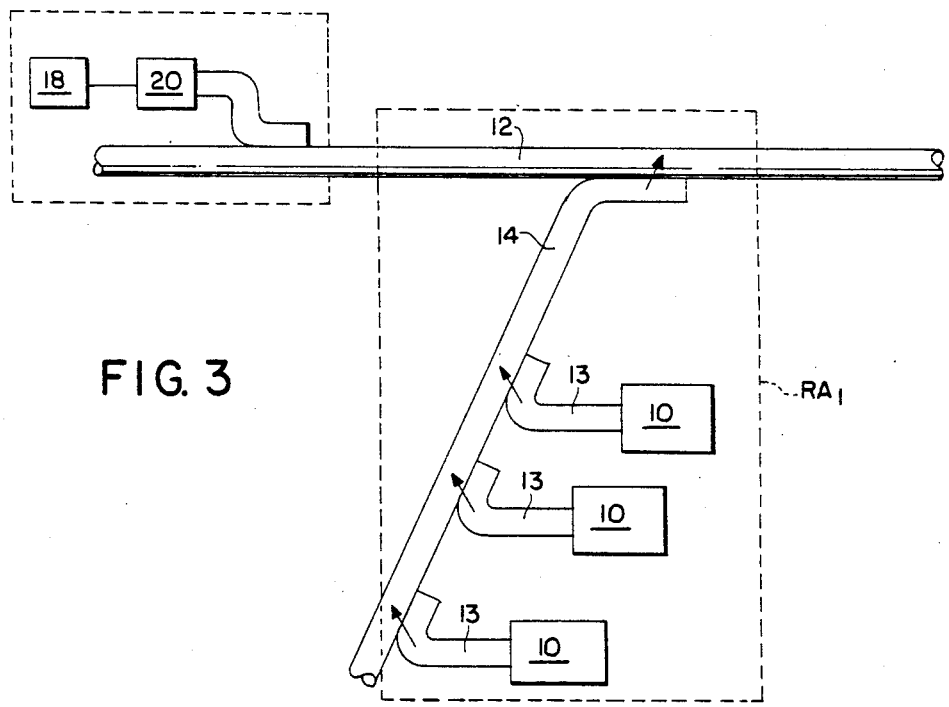
FIG. 3

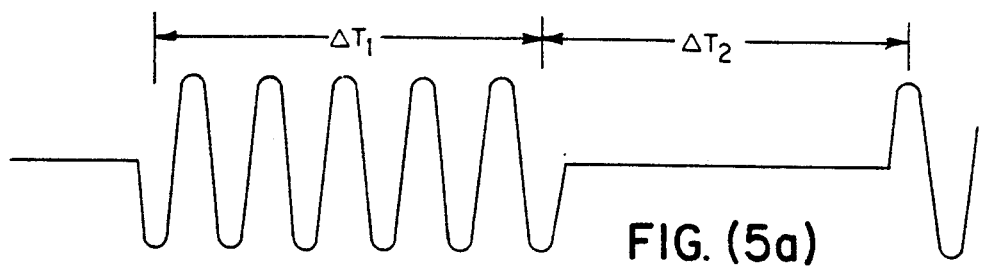
FIG. (5a)
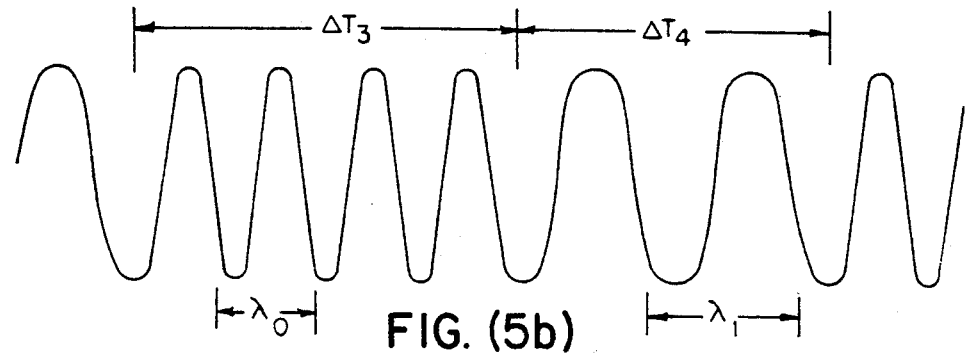
FIG. (5b)
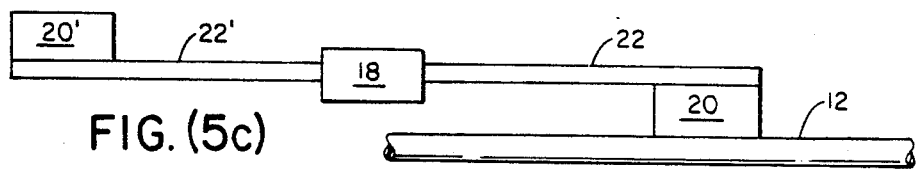
FIG. (5c)
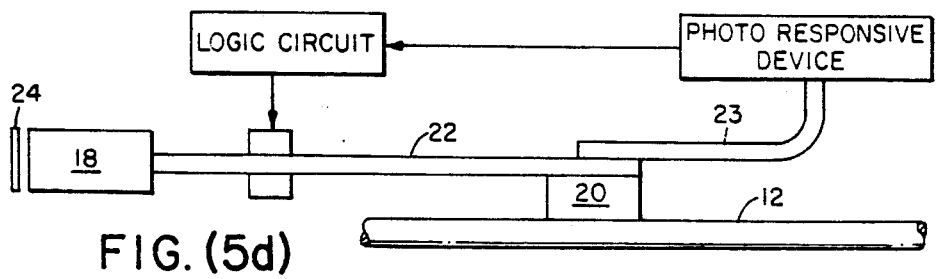
FIG. (5d)

OPTICAL COMMUNICATION SYSTEMS USING RAMAN REPEATERS AND COMPONENTS THEREFOR

CROSS REFERENCE TO RELATED APPLICATIONS

This patent application is a continuation-in-part of pending U.S. patent application Ser. No. 403,759, filed July 30, 1982 for AN OPTICAL COMMUNICATIONS SYSTEM USING RAMAN REPEATERS, now abandoned, which application, in turn, is a continuation-in-part of U.S. patent application Ser. No. 135,798 filed Mar. 31, 1980, for a COMMUNICATIONS TUNING CONSTRUCTION, now U.S. Pat. No. 4,342,499.

BACKGROUND OF THE INVENTION

1. Field of the Invention

The present invention relates, in general, to the communication arts and, more particularly, to optical fiber communication systems in which multiple information channels are carried on a single mode optical fiber.

2. Description of the Prior Art

As optical fiber technology has advanced, there has been a general appreciation and recognition that optical fibers can be fabricated having the capacity to transfer information at extremely high rates. To exploit the maximum information transfer rates possible with optical fiber systems, however, the data must either be time-division multiplexed or multiple, wavelength-distinct information channels must share a common communications path. With respect to time-division multiplexing, there is, apparently, no electronic circuitry available that is capable of switching at pulse rates which approach the information handling rates of single mode optical fibers (viz., $5 \times 10^9$ pps). Additionally, there previously has apparently been little progress with the latter wavelength division multiplexing approach because practical solutions to its problems in optical fiber systems have not been generally known. These problems in general are related to the difficulty in obtaining low cost, spectrally narrow, stable sources; the difficulty, particularly with single mode fibers, in splicing fibers one to another and in coupling energy from sources to fibers; the difficulties associated with amplifying signals; and the difficulty in selectively adding and removing signals to and from fibers.

With respect to spectrally narrow, stable sources, solid-state laser diodes, which are a preferred source, are comparatively expensive. Consequently, their utilization in an optical fiber communication system is only economically justifiable if high bit rates are attainable. For example, if a light-emitting diode and a graded index optical fiber can transfer $5 \times 10^7$ pulses per second (pps) over a 20 kilometer (km) trunk line, and, if a laser diode and a single mode optical fiber can transfer $5 \times 10^9$ pulses per second over the same length optical fiber, the latter laser diode and single mode fiber combination represents a cost factor 100 times greater than that for the former combination since laser diodes that have an acceptable operating lifetime presently cost more than 100 times as much as a light-emitting diode.

However, recent advances have been disclosed in the coupling area. For example, in U.S. Pat. No. 3,342,499, filed Mar. 31, 1980 for COMMUNICATIONS TUNING CONSTRUCTION, and U.S. patent application Ser. No. 331,052, filed Dec. 16, 1982 for RESONANT CAVITY FILTERS, structures are disclosed for wavelength multi-plexing signals into single mode optical fibers. Such inventions, including the inventions of U.S. Pat. No. 4,315,666 for COUPLED COMMUNICATIONS FIBERS and the above-referenced inventions by the present inventor, have made it possible to carry many wavelength channels on one single mode optical fiber and to selectively introduce or remove any of these wavelength-distinct channels at any point on the communications line with minimal interference with the other channels and while maintaining communication line integrity. Thus, it is possible to attain high channel capacity in the construction of an optical fiber communication system which can carry a very large cumulative or aggregate information flow without using exceedingly high modulation rates on any one given channel.

As is well-known, practical optical fiber communication systems utilizing wavelength-distinct modulated channels must carry information over an appreciable distance. As is also known in the art, despite significant advances in diminishing the attenuation characteristics of optical fibers, signals transmitted through optical fibers are attenuated by the cumulative and combined effect of absorption and scattering. While the attenuation rates of existing optical fibers are quite low, signal diminishment with increasing transmission distance nonetheless requires periodic signal reconstitution or amplification. In the past and in accordance with classic communication system practice, periodic signal amplification has been achieved using in-line repeaters which are inserted into the communications line thus interrupting the integrity of the line. The classic repeaters include an input port for receiving the attenuated signal, an amplifier or other signal processing device, and an output port coupled to the downstream communications line and to which the reconstituted signal is applied. In these systems, the attenuated signal is presented to a photoelectric device which converts the optical signal into a corresponding electrical signal. An electronic amplifier or signal processor then amplifies and conditions the signal to compensate for signal deterioration. Thereafter, the electrical signal is presented to another photoelectric device which provides an optical signal which is then launched onto the downstream optical fiber. The conversion of the optical signal to an electrical signal and reconversion back to an optical signal imposes an artificial limitation on an otherwise entirely optical system. In addition, the classic in-line repeater approach presents an undesirably high system-wide sensitivity to single repeater failure, because failure of the repeater destroys the line integrity.

In addition to the above, it can be appreciated that the fabrication of a repeater for an optical fiber communications system carrying many wavelength-distinct channels can become quite complex and expensive, since each channel must be removed separately from the line, processed separately to effect reamplification and conditioning, and remultiplexed with the other signals onto the next downstream optical fiber segment.

With respect to purely optical amplification, the art has shown devices relying on stimulated Raman scattering to convert the wavelength of one source to an amplified output at another wavelength, but there apparently has been no suggestion utilizing Raman scattering for the amplification of information-bearing signals, particularly multiplexed signals.

Pursuant to the above, it is a broad overall object of the present invention to provide a simple, reliable, and relatively economical optical fiber communication system capable of transferring information at high data rates.

Another object of the present invention is to provide an optical fiber communication system in which transmitted signals are amplified by purely optical mechanisms rather than by the electronic techniques used in the past and by which information can be transmitted by wavelength modulation using a plurality of information carrying wavelength-distinct channels.

Another object is to provide a means by which signals carried on an optical fiber transmission line can be collectively amplified without interrupting the line.

Yet another object is to provide a redundant amplification means along an optical fiber transmission line carrying several channels.

And another object is to provide a system which includes means for automatically controlling amplifier power levels.

Still another object is to provide a spectrally narrow, low cost, stable optical signal generator capable of being modulated.

Other objects of the invention will, in part, be obvious and will, in part, appear hereinafter. The invention, accordingly, comprises the apparatus possessing the construction, combination of elements and arrangement of parts which are exemplified in the following detailed disclosure.

SUMMARY OF THE INVENTION

In accordance with the above objects and others, the present invention provides for an optical fiber communications system that includes one or more optical fiber lines coupled to define a system, means coupled to the optical fiber transmission line for introducing information-bearing signals onto the transmission line, and means coupled to the optical fiber transmission line for amplifying the information signal by optical means.

The signal introducing means preferably takes the form of a signal generator that provides modulated wavelength-distinct signals and which includes an energizable gain medium coupled to a Fabry-Perot interferometer through a coupling optical fiber of selected length and tunable to provide a stable signal source.

The optical signal amplifying means, in accordance with the present invention, takes the form of means for introducing Raman pumping beams onto the optical fiber tranmission line for increasing the energy level of the signal-carrying optical signals.

The present invention provides for an optical fiber communications system in which the information bearing signals can be readily amplified by purely optical means to compensate for the adverse effect of attenuation and by which the physical integrity of the transmission line is not compromised. In addition, a wavelength modulation arrangement is provided by which a plurality of wavelength-distinct information bearing channels can be transmitted through the optical fiber and by which these plurality of wavelength-distinct information-bearing channels can be uniformly amplified by the optical amplifiction means.

BRIEF DESCRIPTION OF THE DRAWINGS

The novel features that are considered characteristic of the invention are set forth with particularity in the appended claims. The invention itself, however, both as to its organization and method of operation, together with other objects and advantages thereof, will be best understood from the following description of the illustrated embodiments when read in connection with the accompanying drawings wherein like numbers have been employed in the different figures to denote the same parts and wherein:

FIG. 2 is a generalized graphical representation of the Raman and Brillouin normalized gain coefficient for fused silica;

FIG. 3 is a schematic representation of a preferred embodiment of an optical Raman effect signal amplifier and a signal generator;

FIG. 5a represents a pulse code modulation scheme in which information is encoded by the presence or absence of a pulse;

FIG. 5b illustrates a constant amplitude, wavelength shift modulation scheme in which information is transferred in accordance with the presence or absence of information at a selected wavelength;

FIG. 5c is an illustration of an alternate embodiment of the signal generator shown in FIG. 5;

FIG. 5d is a schematic representation of a modulatable signal generator of the type shown in FIG. 5;

FIG. 7 is a plot of the propagation constant as a function of wavelength for the fiber construction of FIG. 6a;

DETAILED DESCRIPTION

Figure 1:
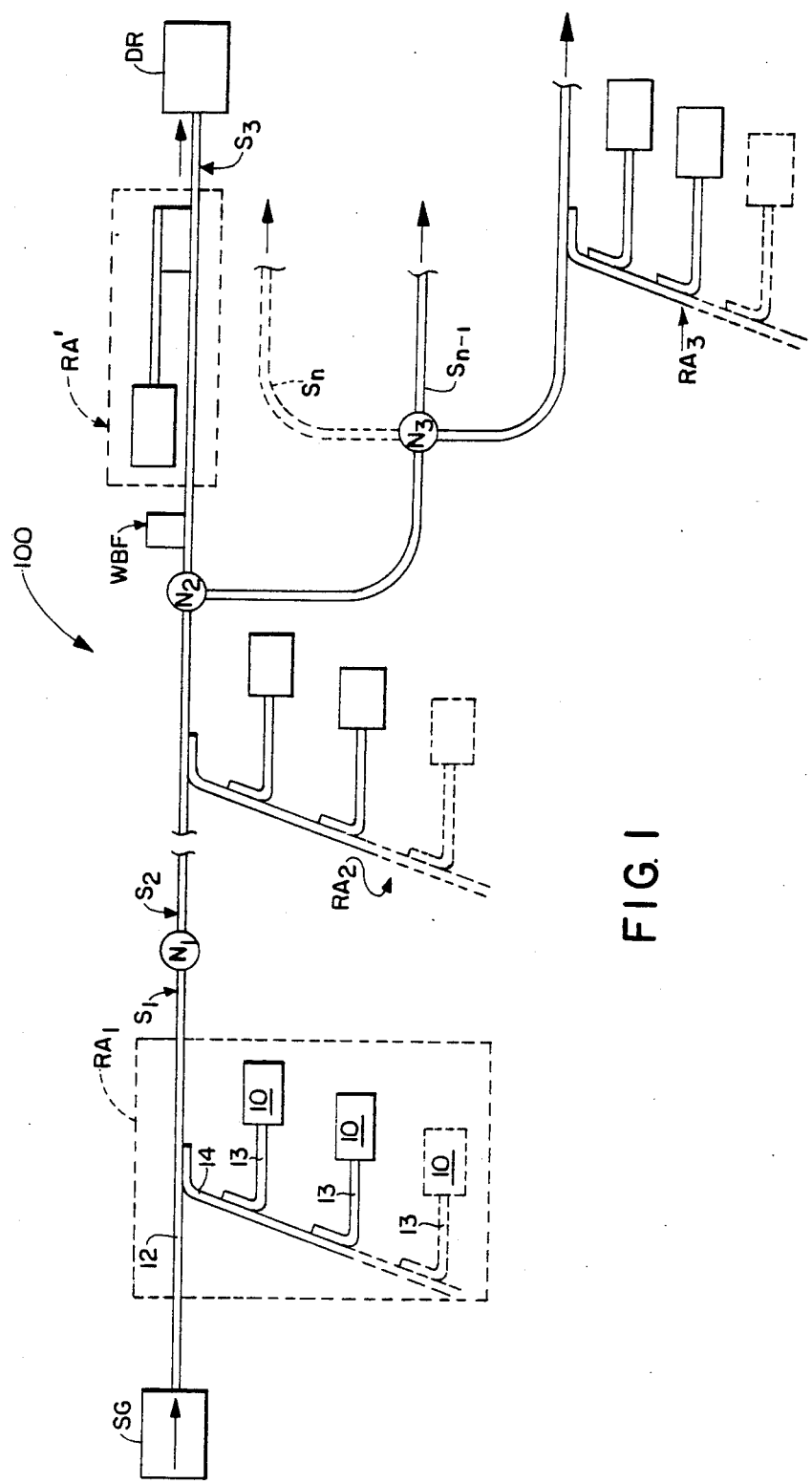
FIG. 1 is a generalized schematic diagram of an optical communications system in accordance with the present invention utilizing Raman effect amplification to periodically effect signal regeneration.

A communications system in accordance with the present invention is generally illustrated in FIG. 1 and referred to therein by the reference character 100. As shown in FIG. 1, the communications system 100 includes a plurality of optical fiber segments $S_1, S_2 \ldots S_{n-1}, S_n$ interconnected at nodes $N_1, N_2 \ldots N_n$. Depending upon the system topology, the nodes N may be simple two-fiber optical couplings or connections or more sophisticated multi-fiber branching type couplings as illustrated at nodes $N_2$ and $N_3$ in FIG. 1. The interfiber couplings are preferably implemented in accordance with applicant's above-referenced U.S. Pat. No. 4,315,666 for COUPLED COMMUNICATIONS FIBERS. The coupled optical fibers $S_1, S_2 \ldots S_{n-1}, S_n$ represent a communications or signal transmission system that, as shown in FIG. 1, is of the open loop system type, well suited for telecommunications. As can be appreciated, the communications system 100 can be closed upon itself as is common in control system and data processing networks. Information-bearing optical signals are introduced onto the transmission line at a selected point by a signal generator SG, discussed more fully below, and conveyed throughout the system to one or more utilization devices coupled to the transmission link at output ports, such devices including the data receiver DR. The information-bearing optical signals may take one of several forms including the usual pulse code modulation schemes such as pulse position modulation, pulse duration modulation, etc., as well as the preferred multiple, modulated wavelength-distinct channels described more fully below.

As is known in the art, optical signal strength diminishes with increased transmission distance because of attenuation and, in accordance with the present invention, signal amplification or regeneration is accomplished by utilizing one or more Raman effect amplifiers which inject a pump beam or beams into the transmission line at a frequency higher than that of the information-bearing optical signals to effect Raman amplification of the lower frequency information-bearing signals. In FIG. 1, two Raman amplifier embodiments are shown including Raman amplifiers $RA_1$, $RA_2$, $RA_3$ and Raman amplifier $RA'$, both embodiments of which are discussed more fully below. The Raman amplifiers may be placed along the main trunk line as in the case of Raman amplifiers $RA_1$, $RA_2$, and $RA'$ as well as along a branch line as in the case of Raman amplifier $RA_3$. The Raman pump beam is introduced onto a continuous portion of the optical fiber so as to maintain the fiber's physical integrity, as contrasted to the classic in-line repeater approach by which the transmission line integrity must be compromised to effect repeater insertion.

In the communications system 100 of the present invention, the information-bearing optical signals are amplified or regenerated by use of the stimulated Raman effect. As described more fully below, optical signal amplification provides a means by which the information-bearing signals may be collectively uniformly amplified by purely optical techniques without the need to interrupt the physical integrity of the transmission line to convert the optical signals to an electrical signal, which is then processed electronically, and to reconvert the electrical signal into an optical signal as has been done in the past.

The spontaneous Raman effect relates generally to a scattering phenomenon which occurs where a media is irradiated with light of a quasi-monochromatic nature. Scattered light is principally of the frequency of the monochromatic irradiation but, in addition, lower frequency, longer wavelengths than exist in the original irradiating beam are re-radiated from the media and re-radiation is a function of the media irradiated. In stimulated Raman scattering, two monochromatic photon sources are simultaneously incident on a medium, one corresponding to a pump and having a higher frequency, $v_p$, than the other of lower frequency having a scattering frequency, $v_s$. Under these circumstances, the source at the higher frequency, $v_s$, will be amplified. The amplification is given by the expression, neglecting absorption and surface reflections:

$$P_s(l) = P_s(o) \exp[g(\Delta v) P_p l / a]$$

where $\Delta v = v_p - v_s > 0$, $P_p/a$ is the pump intensity, and $l$ is the medium length. The term $g(\Delta v)$ is termed the gain coefficient, which is related to the Raman cross-section of the medium, and is a measure of the Raman interaction.

The amplifier of the present invention is based on the observation that the stimulated Raman scattering effect can be exploited to collectively optically amplify a series of signals, each carried on a wavelength distinct channel, if a pump source and the signals travel in the gain medium in the same direction because photons of the higher frequency, shorter wavelength beam are converted into lower frequency, longer wavelength photons. The gain possible is given by the gain coefficient, $g\Delta v$, referred to above and is illustated in normalized fashion for doped fused silica in FIG. 2 where the pump frequency, $v_p$, is coincident with the ordinate axis and $\Delta v$, measured along the abcissa represents the frequency difference, in wavenumber difference, between the pump frequency $v_p$, and now any carrier signal frequency, $v_s$, modulated or unmodulated, instead of the usual lower frequency scattering frequency.

The Raman gain coefficient for fused germania is similar in shape to that illustrated in FIG. 2 for doped fused silica, but somewhat greater. Both silica and germania are the preferred materials for optical fibers used in communications systems as contemplated by the present invention. It is also to be noted that the Raman gain coefficient spectral range illustrated in FIG. 2 is relatively wide. Thus, a given pump or amplifier beam at a selected frequency can be used to transfer energy to or amplify, at varying levels, a range of lower frequency, longer wavelength information-bearing frequencies.

In addition to the Raman amplification effect noted above, a light beam is also subject to Brillouin backscatter, by which a wave of a slightly lower frequency than the primary wave, but higher in frequency than the frequency of the Raman scattering wave, is created and propagated backwardly from the primary beam. The Brillouin backscatter gain coefficient for doped fused silica is illustrated in greatly exaggerated terms in FIG. 2 (broken line illustration) since its bandwidth is less than 1.0 Angstrom wide. As shown therein the Brillouin gain coefficient is of a slightly lower frequency, than the primary beam and spaced, in terms of frequency, closely thereto, relatively sharp, and of a relatively higher amplitude than the Raman scattering gain coefficient.

As shown generally in FIG. 1 and in further detail in FIG. 3, a Raman amplifier $RA_1$ in accordance with the present invention includes a plurality of individual Raman amplifier light generators or pump sources 10, preferably in the form of laser diodes whose outputs are preferably separated in wavelength in a manner to be described. Each light generator 10 is coupled by respective coupler line segments 13 which are preferably connected to a main tap 14 by lateral coupling techniques as disclosed in the aforementioned U.S. Pat. No. 4,342,499 which relates to wavelength selective tuned couplings between optical fibers, and U.S. patent application Ser. No. 331,052 which relates to resonant cavity filter coupling of optical fibers. The main tap 14 is similarly coupled by lateral coupling to the main trunk 12, i.e., fiber, $S_1$. Additional Raman amplifier stations, $RA_n$, are repeated down the transmission line as required to maintain signal level. The couplings between the coupler line segments 13 and the tap 14 are wavelength selective as taught in the aforereferenced patent and patent application so that pump signals from a first Raman generator 10 will not be coupled to one or more of the other Raman generators 10, in effect, preventing the pump beam energy generated by one light generator 10 from being reflected or returned into the other light generators 10.

Figure 4:
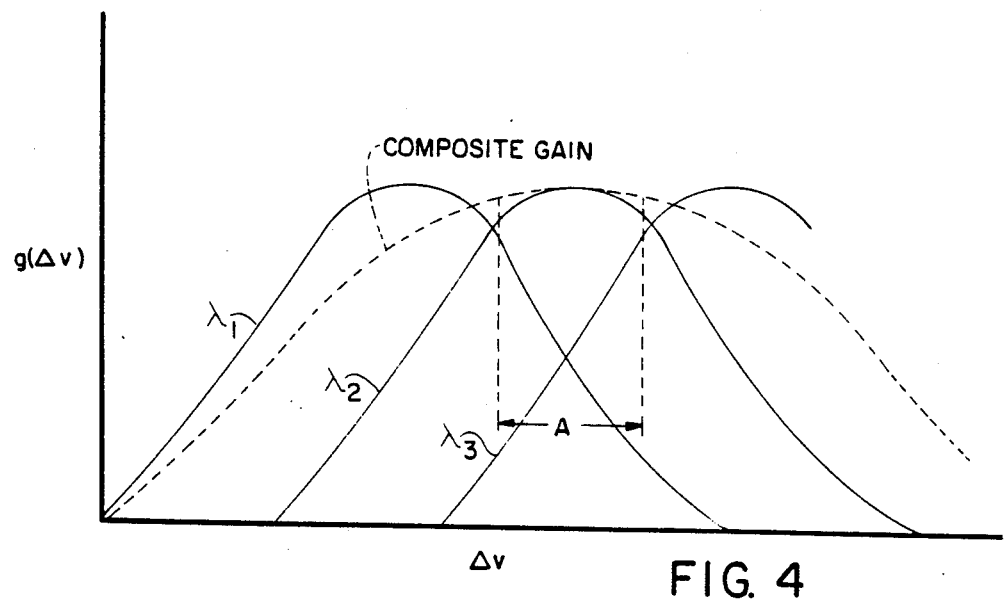
FIG. 4 is a composite Raman gain coefficient curve (broken line illustration) for multiple Raman beam amplification used in the present invention.

The use of more than one Raman light generator 10 provides a means by which either only substantial additional amplification of signals can be achieved or by which additional amplification and an increased channel bandwidth can be achieved, depending on the wavelength separation between the generators 10. The closer the spectral output between the generators 10, the more the effect will be towards pure additional signal amplification and the wider the difference, the more the effect will be toward channel bandwidth broadening and increased amplification. This will be apparent by referring to FIG. 4, which shows a normalized composite gain curve which is the cumulative gain obtained by adding the gain curves for the contributions of each pump frequency, $\lambda_1, \lambda_2, \lambda_3 \ldots \lambda_n$. As will be appreciated, a separation too great between generator wavelengths will cause non-uniform amplification. Therefore, it is preferred that the wavelength separation between the generator sources 10 not be greater than an amount where the channel amplification falls below 25 percent of the peak gain possible. That is, it is desirable to have a broad and flat composite gain curve where all the channels selected fall under a region (A) of the composite gain curve.

While multiple solid-state laser diodes 10 are the preferred source of the Raman pump beams, other sources such as are used in the alternate embodiment Raman amplifier RA', discussed more fully below, which deliver a similar set of spectral lines are suitable. Other sources include multi-line Raman oscillators powered by YAG lasers.

It is known in the art that laser amplification can be noisy as is any amplification of a limited number of photons. Repeated optical amplification in an optical fiber transmission system can result in the accumulation of noise. For example, if N-photons are in a pulse, and the pulse is amplified by a gain factor G, a certain probability distribution of the number of photons, centered about GN, is created. As the now amplified beam travels down the fiber, a further widening of this distribution curve occurs. Each additional signal amplification and subsequent transmission adds to the distribution curve spread. In the present invention, the effect of accumulated noise resulting from successive signal amplification and retransmission is mitigated by a number of steps comprising the use of signal levels higher than otherwise would be necessary to effect reliable information transfer; the use of low signal modulation rates; and the use of a spectrally narrow signal source of the type to be described more fully hereinafter. In a preferred embodiment of the invention, a signal amplifier, RA, is preferably provided wherever the signal level drops to the point where $N = 100 R$ where N is number of photons per pulse and R is the number of Raman amplifiers, RA, in series between signal processors. If there are no signal processors, then R is the number of Raman amplifiers, RA, between the signal source and the signal detector or other signal utilization device. The criteria presented is not rigid and some flexibility can be permitted depending upon the following criteria. If there are several amplifiers, RA, with varying longer and shorter distances between the amplifiers, the above criteria can be on an average basis. The broadening of the statistical distribution curve is non-linear, and broadening will be worse than the average value would indicate. Additionally, the criteria is dependent upon and a function of the signal traffic along the line. Computer data need much lower error rates than video data. If the system is being used primarily for data transfer, an appropriate design criteria is to adjust for allowable video error rates and then transfer data at a rate lower than the video rate to reduce the occurrence of errors. For example, a $10^8$ baud rate is adequate for commercial video, and a $5 \times 10^8$ baud rate will deliver studio quality video. These baud rates are higher than data rates now in use for transferring computer data.

A pulse bandwidth, where modulation is by one of the pulse code techniques, in excess of that required for reasonable pulse shape retention is not desired from the standpoint of group velocity dispersion and the introduction of excess noise from spontaneous Raman scattering into the information-carrying signal channels. Group velocity dispersion of the signal wavelength components is proportional to the spread of wavelength in the signal channel. Accordingly, an excess spectral width needlessly broadens the signal pulses because of dispersion and reduces the length of fiber over which the signal can be transmitted without signal processing or conditioning.

In the past, in order to minimize dispersion and degradation of the signal waveshape, a substantial effort has been made in developing fibers with zero dispersion and/or with low dispersion over an extended range. In addition, attempts have been made to shift the dispersion regions to the longer wavelength, lower frequency regions to thereby secure lower attenuation at the preferred wavelengths.

In accordance with the present invention, the dispersion problem is almost completely solved by narrowing the wavelength spread of each channel. In this way, information-bearing signals can be transmitted in any desired region of the spectrum regardless of whether or not dispersion is low in that region. Additionally, an advantage is gained by using many closely spaced signal carrying channels at low modulation rates in contrast to the use of a few signal channels at very high modulation rates. The relatively lower modulation rates subjects the so-modulated signals to less dispersion degradation since each pulse has a longer duration or width in time, as contrasted to the pulse duration using very high modulation rates. In accordance with the present invention, modulation rates higher than the rate provided by the highest signal source commonly used are preferably not employed, that is, pulse modulated 3-color video which is modulated on the order of $10^8$ pulses per second.

With regard to the introduction of excess noise into the signal channels from spontaneous Raman scattering, the spontaneous Raman scattering of the pump beam into each possible electromagnetic state of the fiber can be represented as the number, S, photons per unit time. The rate of stimulated scatter will be SN where N is the number of photons already in that state. In the context of pulse modulated signal transfer, for any given time equal to the pulse width, there will be either a pulse present or no pulse. If there is no pulse, there will be S photons scattered into each possible electromagnetic state of the fiber, which corresponds to the no pulse time interval. On the other hand, there will be SN photons stimulated into a pulse width of the same duration if there are N photons in the pulse. The amplified signal from a pulse interval is then:

$$N_{out} = (N_{in} + n) G - n$$

where G is the gain and n is the number of possible electromagnetic states in a pulse. $N_{in}$ is the number of photons in the pulse interval as it enters the amplification region and $N_{out}$ is the number of photons in the pulse interval as it leaves that region. In the case where the gain, $G=1$ (no amplification), the number of photons in each interval is unchanged. On the other hand, where the gain G is relatively large, then the no-pulse intervals will act as if they contained n photons, where n is number of electromagnetic states in the time interval. Since the number of electromagnetic states, n, in a pulse interval is proportional to the ratio of the bandwidth to the pulse rate, using a bandwidth no greater than that necessary provides reasonable pulse shape retention and aids in reliable information transfer.

As can be appreciated, where there are many Raman signal amplifiers, RA, in series, and each amplifier drops n photons into every no-pulse region, the ratio of the photon population between the pulse and no-pulse intervals is rapidly degraded, thereby making pulse discrimination more difficult. Accordingly, it is desirable to use the lowest bandwidth consistent with the desired waveform fidelity. In addition, the signal level is not allowed to fall below the point where the number of photons in a pulse is less than $20 \times Rn$, where R is the total number of Raman amplifiers RA in series, before using signal processing, and where n is again the number of states per pulse interval width. These criteria assure an adequate signal-to-noise level in multiple Raman amplifier situations.

It has been further found that a bandwidth from 1 to 2 times the pulse repetition rate (PRR) is adequate. With a bandwidth of 2, the criteria for photon number is less stringent than $N=100R$ as previously discussed. With a bandwidth of 5 times the pulse repetition rate, the criteria are equal. Accordingly, any widening of the bandwidth beyond 5 times the pulse repetition rate requires increased power levels.

Both dispersion and amplifier noise can be controlled in a desirable manner by limiting the bandwidth of each channel. The bandwidth limiting also enables the number of channels in any given region of the spectrum to be increased and that, in turn, allows the various channels to remain within a narrower range of the Raman gain curve for a given number of channels. The compression or grouping of a selected set of signal-bearing channels into a narrow region, such as region "A" of FIG. 4, of the Raman gain coefficient curve facilitates an approximate flat gain across the set of channels and also desirably minimizes the transfer of energy from the shorter wavelength, higher frequency channels to the longer wavelength, lower frequency channels. In this regard, channel-to-channel separation should be no less than the modulation rate and need be no greater than 3 times the modulation rate for effective channel discrimination at the data receiver.

The desirable aspects of channel compression or grouping can be realized from a review of the Raman gain curve plot of FIG. 2. As shown, the gain across the gain spectrum for the Raman amplifier varies in a non-uniform manner with the difference in wavelength number between the pumping beam and signal-carrying channel. If the channel spread is relatively wide, the respective gains imparted to the various channels would not be equal, with some channels being amplified more greatly than others. This unequal amplification or gain effect would be multiplied with each additional Raman amplification. A narrow grouping or compression of the channel bandwidth permits concentration of the channel spectrum and the spectrum positioning to a portion of the Raman gain coefficient curve that imparts a flatter gain across the channels, such as again region "A" of FIG. 4.

One concomitant effect of the introduction of the Raman amplifier pump beam(s) is the production of Brillouin backscatter which receives its energy from the Raman amplifier pump beam(s). Since the Brillouin scattering gain spectrum is much higher in magnitude than the Raman scattering gain spectrum in fused silica, there is a propensity to convert the Raman amplifier pump beam energy into a backward travelling wave, slightly shifted in terms of wavelength, instead of the desired amplified signals. As this spontaneous Brillouin scatter caused wave travels in a direction counter to the Raman amplifier pump beam, the spontaneous wave gets amplified by stimulating further Brillouin scattering. The rate of amplification is on the order of 100 times as great as that for the Raman amplification, if the Raman amplifier pump beam has a line width that is less than the Brillouin scattering line width. Thus, once the backward Brillouin beam has reached 1/100 the combined signal power, ½ of the Raman pump beam power is being converted into the undesired backward-travelling wave and very quickly thereafter, pump power will go almost entirely into the unwanted wave.

Brillouin backscatter, in addition to causing a loss of pump power, is subject to variable amplification. More specifically, when a Raman amplifier pump beam is turned on, its leading edge generates spontaneous Brillouin backscatter which, in turn, is amplified in a progressive manner by the following part of the Raman pump beam. As the Brillouin caused wave progresses further down the fiber, that part just entering the fiber is increasingly "deamplified" by the backward travelling wave. After a sufficient penetration down the fiber, part of the wave just entering will be completely converted by the backward wave. The pump wave thereafter oscillates in intensity. This, of course, leads to a variable Raman amplification of the desired signals which produces a significant problem, greater than that of the inefficiency of amplification.

The above-described dynamics and the efficiency of the Raman amplifier pump wave are further complicated by creation of a third generation wave; that is, Brillouin backscatter from the Brillouin backward wave and by line broadening resulting from the 4-photon mixing process. In order to avoid or minimize the above-described conversion of the Raman amplifier pump power into a Brillouin backward wave and the variation with time resulting from this wave, the pump beam is desirably broadened spectrally. Although the Brillouin gain is much higher than the Raman gain, it is very narrow spectrally (approximately $7 \times 10^7$ Hz) but is shown in FIG. 2 in greatly expanded terms. Accordingly, when two Raman amplifier pump lines are utilized instead of one, and they are separated by more than $7 \times 10^7$ Hz, each pump beam will then interact with its own Brillouin backward wave, but much less with the backward wave of the other pump beam. Yet, since the Raman gain is quite broad, both pump lines combine to pump a given signal channel or set of signal channels.

The use of no less than two Raman spectral lines (separated by more than $7 \times 10^7$ Hz for each decibel of Raman gain desired) is recommended. If the Raman pump lines are broader than the aforementioned $7 \times 10^7$ Hz, then the rule can be correspondingly relaxed.

In the preferred embodiment described herein, solid state laser diodes are used as the Raman amplifier pump sources. While the spectral line width of a laser diode is commonly depicted as being much wider than $10^7$ Hz, it is not always the case. If such a diode is used in the continuous power mode (not modulated), all the power may eventually drop into one spectral line (particularly if the laser diode has been designed to do that) and that line can become quite narrow spectrally. The exact wavelength may wander somewhat with time, but such a frequency variation is not helpful in avoiding or cancelling the effects of the Brillouin backward waves unless this variation can be counted on to occur continuously and rapidly, which is not the case. Therefore, and in accordance with the present invention, several spectral lines are delivered. By using multiple diodes, increased reliability is also obtained. And if one diode fails, the overall gain imparted to the signal carrying channels drops by only a small amount.

The use of multiple laser diodes provides a fail-operational feature not found in classic repeater situations previously utilized.

In addition to using a plurality of laser diode sources for delivering plural spectral lines, reliable and deliberate broadening of the spectral output of a solid-state laser to also produce a plurality of spectral lines can be achieved by modulating the electrical power input into the diode. For example, if the modulation rate is greater than $5 \times 10^7$ Hz, at least two narrow spectral lines will be produced (from the Fourier transform of the modulated signal line). Modulating the electrical power input at anything less than a frequency five times as high as the signal modulation frequency may impart a gain ripple onto the signal channels which may interfere with signal discrimination and the interpretation of the signals. If more power per laser diode than is consistent with avoiding Brillouin backward waves is contemplated and modulation line splitting or broadening is used, the modulation rate should be at least 10 times the signal modulation rate. In addition, means may also be provided for causing the Raman beam to travel at a different group velocity from the signal group velocity, which causes any pattern in the Raman beam to sweep past the signal channels and thereby reduce any imprinting.

An alternate criterion for maximum ripple length which will not unduly imprint the signal channels can be arrived at by first establishing the length of the transmission line over which Raman amplification takes place. This, of course, depends upon the line and other losses. Assuming the loss is a realistic 0.25 dB per kilometer, then the drop in Raman pump power will be a factor of 2 over 10 kilometers. If the transfer to signal power makes the pump power drop faster than this, a shorter length may be used.

In order to calculate the maximum safe ripple length, the difference in group velocities of the pump beam and that of the signal channels multiplied by the amplification length and divided by the average of the group and signal velocities should desirably be longer than the ripple length, which corresponds to the modulation rate of the diode. This is expressed by the following equation:

$$\text{Ripple length} \leq \frac{2L(V_p - V_s)}{V_s + V_p}$$

When using several Raman pump lines, there is a tendency for the shorter wavelength pump lines to pump the longer wavelength pump lines. Accordingly, the power levels of each successive lower frequency, longer wave length diodes should be adjusted downward or otherwise compensated to provide an overall flat gain curve for the signal channels.

If the modulation rate is $10^8$ pulses per second, then the spacing between spectral lines in the pump beam should be at least $10^9$ sec.$^{-1}$. In a similar way, any beat pattern occurring between two spectral lines (as well as the composite beat pattern) should produce a ripple whose length obeys the same criteria as set forth above for the modulation of the laser diode. Accordingly, means may be also provided for the creation of spectral lines in the pump beam which are spaced widely in wavelength compared to the signal bandwidth.

As indicated above, to minimize Brillouin backscatter, it is desirable to have a plurality of spectral lines in the Raman pump beam, say 20. Whether one uses 20 separate laser diodes each with one line or a lesser number of diodes, modulated to provide multiple lines, will depend on the power per diode available, on reliability and life expectancy, and the number of signal amplifications along the transmission line. The optimum design configuration will change as the cost and performance specifications of diodes further evolve. In any case, it can be seen that economics alone justify using the aforedescribed Raman type signal amplifiers when the number of wavelength channels exceeds the number of diodes required per Raman signal amplifier since to multiplex, detect, and regenerate signals will require one diode per channel. At the present state of the art, the Raman signal amplifier described herein justifies itself on a basis of component costs alone if there are at least 20 wavelength-distinct channels. Additionally, taking reliability factors into consideration, Raman signal amplification as described herein is justified with a lower number of channels.

As described here in the context of FIG. 1, the use of Raman signal amplifiers in long transmission lines is the most exacting and xost impressive use, although a single Raman signal amplifier can be used to advantage in several contexts. For example, in very short communication systems which require extensive modulation, switching, and multiplexing, Raman amplification of the type described herein can be used to effect signal amplification. It can also be advantageous to pump the signals once even if the line is short.

In addition, in a local area network, local distribution system, or switching station, it may be advantageous to amplify the signals to a level well above that required to avoid photon noise simply to make detection and discrimination more reliable and to permit the use of less expensive and less sensitive detectors.

With regard to the generation of signal pulses, conventional solid-state laser diodes are adequate at the lower pulse repetition rates. However, generation of pulses of $10^8$ pulses per second with an ordinary solid-state laser may be impractical since output will not be a pulse with narrow spectral width. When a laser diode first starts oscillating after receiving a current pulse, it may initially generate several orders of resonant lines, with the order nearest the peak material gain being dominant. The central order will then remove energy from the side orders, provided the diode is so designed, and finally the central line will become increasingly narrower although with some drift. Accordingly, output of this type is not suitable for narrow line, highly multiplexed systems of the type described herein.

Figure 5:
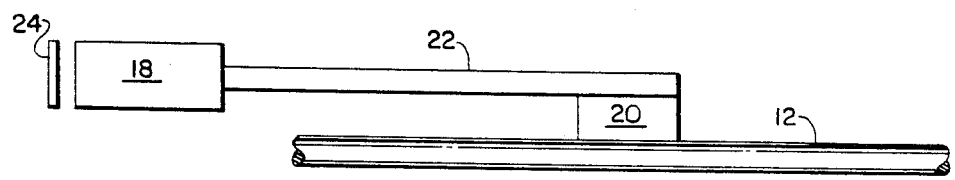
FIG. 5 is a schematic illustration of one preferred embodiment of a pulse signal generator in accordance with the present invention.

In view of the above, a pulse signal generator, SG, embodiment in accordance with the present invention incorporates a gain medium operating as an amplifier with an external interferometric or resonant cavity device for precisely controlling the spectral output of the combination. As shown in FIG. 5, a well-known gain medium 18, including a well-known means of energizing the gain medium to cause a population inversion at its atomic level, is provided with a reflective end 24 and is coupled to and outputs onto a fiber optic pigtail 22, which, in turn, is laterally coupled to a Fabry-Perot resonator device 20, which in turn, is laterally coupled onto the trunk line 12. In the pulse signal generator SG of FIG. 5, the Fabry-Perot resonator 20 operates to oscillate optical energy of a predetermined wavelength and send it back through the gain medium 18 until the combination lases to provide the desired wavelength output. The pulse signal generator SG is a slow starter and not suitable for rapid high-rate pulse generation or rapid modulation. However, once the pulse signal generator SG goes into oscillation, its wavelength output is substantially as stable as the Fabry-Perot device. The Fabry-Perot device 20 acts as a "flywheel" in this system. Accordingly, if power is removed from the gain medium 18, the pulse signal generator SG continues to emit energy for an additional period of time corresponding to the length of the cavity multiplied by its finesse. This externally-tuned combination oscillator thus can be used as a narrow line spectral source. As will be appreciated, the pulse signal generator SG of FIG. 5 can also be used as a narrow line modulated source if the Fabry-Perot cavity 20 is rapidly tunable in a manner to be described.

FIG. 5a illustrates a conventional pulse amplitude modulation scheme in which a signal is either present at a fixed frequency (that is, during time period $\Delta T1$) or absent (that is, during time period $\Delta T2$). Information is received by sensing the existence or absence of the signal during the $\Delta T$ periods as is conventional in pulse code modulation schemes. FIG. 5b illustrates a wavelength shift modulation scheme in accordance with the present invention in which a substantially constant amplitude signal is modulated at a first predetermined wavelength $\lambda_0$ during the time period $\Delta T3$ or by the second selected wavelength $\lambda_1$ during the time period $\Delta T4$. In FIG. 5b, wavelength $\lambda_1$ is longer than wavelength $\lambda_0$. Intelligent information is imparted onto the constant amplitude waveform by effecting the wavelength shift and likewise decoded by detecting the shift during successive $\Delta T$ time periods.

The modulation scheme of FIG. 5a or 5b presented above may be used with the present invention, but those modulation schemes which permit a constant signal amplitude, such as the wavelength shift modulation scheme illustrated in FIG. 5b, are preferred because they minimize both direct cross-talk in which one signal channel amplifies another signal channel by stimulated Raman scattering or by other non-linear effects and by indirect cross-talk where the signal on one channel imprints the Raman pump beam by depletion and, in turn, the pump beam imprints another signal channel.

The above-described wavelength-shift modulation produces a constant signal amplitude and, consequently, the degree of cross-talk interchannel modulation becomes only proportional to the change in Raman gain with wavelength multiplied by the change in wavelength. Since the wavelength shift is very small, this effect is negligible. Wavelength-shift modulation also decreases the spectral line width required to transmit at a given modulation rate.

In the signal generator of FIG. 5, used in the wavelength-shift modulation mode referred to above, the energy stored in the Fabry-Perot cavity 20 at $\lambda_0$ will immediately shift to $\lambda_1$ where optical length $0/\lambda_0$ = optical length $1/\lambda_1$ where the subscript 0 indicates initial state and the subscript 1 the final state. The Fabry-Perot cavity 20 thus can be made to tune immediately to the altered resonant wavelength without waiting to discharge and recharge its energy level allowing high modulation rates to be achieved using the wavelength shift modulation scheme. The power generated by the combination shifts wavelength as soon as the first shifted wavelength returns from the resonant cavity 20 and enters the gain medium 18. The time lag for the modulation response is therefore almost entirely the mechanical or physical time lag of altering the path length of the resonant cavity 20.

A major advantage with this energy source resides in the fact that the resonant cavity 20 is isolated from the gain medium 18 and therefore the wavelength output is not dependent on conditions within the gain medium 18 which tend to destabilize the output in wavelength. This is so because the fiber composition of the resonant Fabry-Perot cavity 20 is less sensitive to thermal change and can be more easily athermalized than can the commonly available gain mediums and their associated energy pump arrangements.

As is known, Fabry-Perot cavities have many resonant orders and, if desired, the unwanted orders can be suppressed within the device itself or an external filter can be used. When the unwanted resonant orders are suppressed externally of the Fabry-Perot cavity, the lines existing within the Fabry-Perot cavity use available diode power, thereby diminishing available energy for the desired resonant line, and can cause ripples within what should be an otherwise constant energy level pulse. The unwanted resonant orders can be suppressed utilizing the arrangement shown in FIG. 5c. As shown therein, the left end mirror 24 of the gain medium 18 is replaced with a fiber pigtail 22' and a fiber Fabry-Perot cavity 20' similar to the one on the right side. The Fabry-Perot on the left side, 20', is designed with a resonant line characteristic in Vernier relationship to the one on the right, 20, such that only the resonance for the desired order is coincident with the resonance for that order on the right. As can be appreciated, the use of dual Fabry-Perot cavities 20 and 20', as shown in FIG. 5c, provides for an overall signal generation device resonating at the desired spectral line at a substantial energy level. For the device shown in FIG. 5c, the left-side Fabry-Perot cavity 20' must have a lower finesse to allow the shift in tuning due to the wavelength modulation to lie within its resonant line width to thereby avoid the necessity for having to simultaneously modulate both devices.

The coupling of a gain medium to a Fabry-Perot resonator by means of an optical fiber pigtail as shown in FIGS. 5 and 5c differs substantially from the devices known in the art in which a pigtail with a reflective end is coupled to a modified laser diode. In the latter case, the resonant cavity is comprised of both an optical fiber pigtail and the coupled laser diode cavity. If the effective resonant cavity length of the pigtail on the diode cavity is not less than about ¼ radian of any wavelength within the ½-width of the high Q cavity, the device may not oscillate. Laser diodes discard an amount of energy into their body which amount depends upon whether or not the diode is lasing. Also, the diode may undergo a temperature change and hence a change in the optical path length if it drops out of the lasing mode. This shift will tend to continue until the phase deficit is such that lasing will recur. This tendency must be guarded against in the present invention because it becomes more likely as the pigtail length to the Fabry-Perot cavity 20 increases. An undesirable consequence of an unduly long pigtail is that the wave train at a first wavelength already in the pigtail travelling in the direction of the diode will persist at the same wavelength until it has made one round trip back into the Fabry-Perot cavity 20 before the wavelength shift can be implemented. Accordingly, when the devices as described above are used as a spectrally narrow modulator and the Fabry-Perot resonator is pulsed to change wavelength output, it initially begins to discharge that energy onto the output trunk line. For a period of time equal to the round trip time in the pigtail/gain medium, no energy of the proper wavelength is replenished into the Fabry-Perot cavity. Once that time period has elapsed, light of the correct, shifted wavelength will now have proceeded from the Fabry-Perot resonator, through the gain medium and back, and the energy level of the Fabry-Perot resonator will again begin to be replenished.

As the connecting optical fiber pigtail becomes longer, this period of no energy replenishment will, of course, increase. If the period of no energy replacement increases beyond a cetain upper limit, the output energy onto the optical fiber trunk will drop appreciably. The net result with an overly long pigtail is a decaying type output rather than a constant level output consisting of two alternating wavelengths. This condition, of course, is undesirable where a constant amplitude signal is desired and may be avoided with proper regard to the relevant lengths or through an alternate version of the signal generator.

A suitable alternate embodiment of the signal generator for mitigating this effect is shown in FIG. 5d and includes again a gain medium 18, the end mirror 24, a short pigtail 22, preferably less than 10 times as long as the associated Fabry-Perot cavity 20, together with an optically driven feedback device which alters the optical path length of the pigtail (or in a more generic sense, some element in the low Q cavity) in order to establish oscillation. This is accomplished by using a tap fiber 23 to tap off a small fraction of the light from the pigtail 22 or, alternatively, from some portion of the low Q cavity. For instance, the reflectivity within the Fabry-Perot cavity is not by any means 100%, so that a considerable fraction of the light in the low Q cavity will be in the pigtail 22. All or a portion of this energy may be used to actuate a photo-responsive device PD which, in turn, drives a logic circuit LC which acts in a well-known manner as described below.

If no energy, or a very low level of energy, comes out of the pigtail 22, the logic circuit LC will generate an output control signal 'CTRL' which will alter (either increase or decrease) the optical path of the low Q cavity. It will continue driving the change slowly in one direction until oscillation (that is, lasing) occurs. Then in a manner well-known to the art of feedback control circuitry, the feedback output signal 'CTRL' will drive toward a maximum amount of power out of the pigtail 22. Any variation in the driving rate (e.g., hunting) is commensurate with the overall time constant required to build up oscillation in the composite double cavity. If, for example, the Fabry-Perot resonant cavity 20 has a half-width of $10^8$ Hz, the length of time to build up oscillation will be greater than $10^{-8}$ and less than $10^{-7}$ seconds.

With the feedback circuit illustrated in FIG. 5d, the device will stay reasonably well tuned despite slow variations in the optical path length of the gain medium 18. To avoid impressing unwanted amplitude or level variations which might be confused with the signal itself, the time constant of the feedback loop should be at least 10 to 100 times as long as the pulse rate of the system so that amplitude or level corrections provided through the feedback loop will be spread over many pulses and should not represent a discrimination problem with regard to a data receiver. The entire double cavity optical circuit should be mounted so as to decouple it from thermal and mechanical shocks and vibrations so as not to create spurious signal outputs. Of course, the power supply to the gain medium 18 and the electronic feedback circuit should also be free of noise and transients.

The reflections between the two faces of the gain medium 18, after coupling (whatever coupling means is used) should be sufficiently reduced so that the losses for the round trip path within the gain medium 18 itself are greater than the losses in the round trip path between the virtual ends of the combined, extended cavity. This ensures that when the gain is raised to achieve oscillation, the desired mode controlled by the Fabry-Perot cavity 20 does not lose energy to unwanted internal oscillations of the gain medium 18.

Figure 5E:
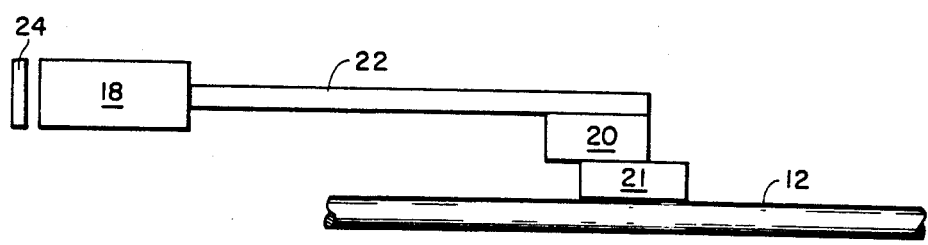
FIG. 5e is an illustration of an alternate embodiment of the signal generator shown in FIG. 5 along with an additional component.

The wavelength shift modulation obtained with the devices described above in connection with FIGS. 5, 5c, and 5d can be converted into an amplitude-modulated signal wavelength device by simply passing the output signal through another Fabry-Perot device tuned to one of the two output wavelengths (that is, $\lambda_0$ or $\lambda_1$ as described above in connection with FIG. 5b). The output of this other Fabry-Perot device (designated at 21 in FIG. 5e), tuned to one of the two output wavelengths of the signal generator, will represent the desired amplitude modulated signal output. The use of the other tuned Fabry-Perot device is preferred to the more classic on/off keying of the modulator, since on/off keying can result in ringing which prevents precise control of the pulses, artificially limits the upper modulation rate, and can give rise to pulse discrimination problems in the data receiver.

Figure 6:
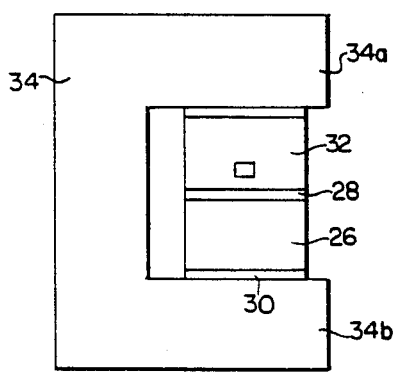
FIG. 6 is a schematic representation of a modulatable Fabry-Perot device for effecting signal modulation in accordance with the present invention.

The aforedescribed laser diode/Fabry-Perot signal source can also be used as a source of narrow line light instead of a modulator. But when modulation is required, the preferred embodiment of a Fabry-Perot device for achieving desired wavelength shift modulation is shown in FIG. 6. As shown therein, the modulator includes a "C" shaped (in cross-section) fixture 34 having upper and lower support extensions 34a and 34b. A piezoelectric crystal 26, having electrodes 28 and 30 on its opposite faces, and an optical fiber 32 are mounted between the upper and lower supports 34a and 34b. An electrical source is connected to the electrodes 28 and 30 to drive the crystal 26 in a conventional manner by an excitation voltage. The piezoelectric effect causes the crystal to physically distort and accordingly apply pressure to the fiber 32, which constitutes the Fabry-Perot resonator as described above. Both the fiber 32 and the crystal 26 are structurally secured together by cement or by other means on the fixture 34 so that the pressure applied by the oscillating crystal 26 is reliably transferred to the optical fiber 32. As can be appreciated, the pressure applied by the crystal 26 effectively alters the optical path length of the fiber 32 and therefore the resonant characteristic of its Fabry-Perot cavity.

In general, optical fibers have two polarization modes and the applied pressure alters the path length of one polarization mode more than that of the other. Accordingly, the Fabry-Perot resonator modulated as decribed will thus have a double set of lines due to the two polarization states. The second, undesired, polarization state may be eliminated by the use of a single polarization fiber as described below.

Figure 6A:
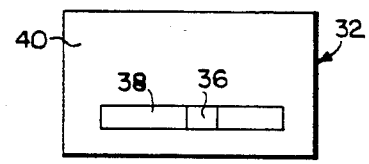
FIG. 6a is a schematic representation of a single polarization mode fiber used with the modulatable Fabry-Perot device of FIG. 6.
Figure 7:
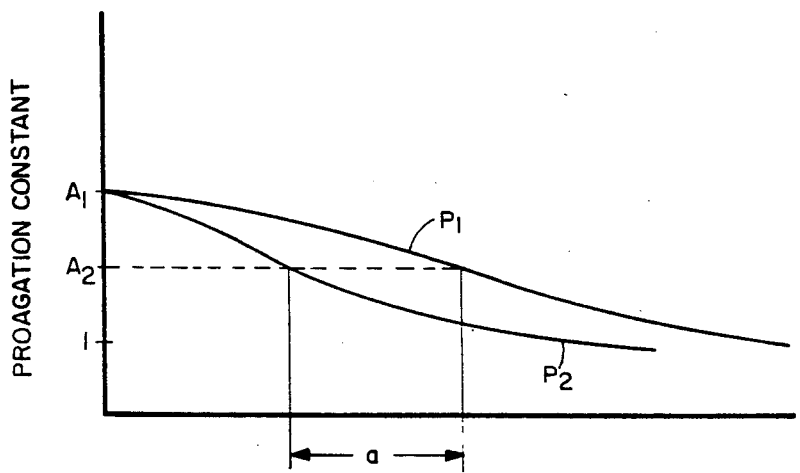

A single polarization optical fiber can be created (as shown in FIG. 6a) by placing a single mode core 36 within a cladding 40 having a cavity 38. The plot of propagation constant as a function of wavelength construction is depicted in FIG. 7. As shown, $P_1$ and $P_2$ indicate the propagation curves for the two perpendicular polarization modes for the core 36 within the cavity 38; $n_1$ represents the index of refraction of the core 36; $n_2$ represents the index of refraction of the cladding 40, and 1 represents the index of refraction of the cavity 38 (that is, air). The propagation curves for both modes decrease as wavelength increases, but at unequal rates as shown. There is a wavelength region (a) in which one polarization mode is beyond cutoff of the lowest order mode. The optical fiber construction illustrated in FIG. 6a can replace the fiber structure shown for the modulatable Fabry-Perot of FIGS. 5, 5c and 5d to provide desired modulation of a single polarization mode. While optical fibers having cavities as represented by cavity 38 cannot be conveniently produced in a preform made by ordinary chemical vapor deposition, preforms made by chemical vapor deposition or otherwise may be combined into more complex preforms by means similar to the well-known rod and tube method and/or with multi-fiber preform techniques commonly used for known fused optical fiber products.

A mismatch in the thermal expansion characteristic between the core material 36 and the surrounding cladding material 40 produces permanent internal stress in the fiber 32 as the fiber cools after drawing during the manufacturing stage. This intentional mismatch in thermal expansion characteristics will enhance the bifringence and accordingly improve the polarization-retaining characteristics of the fiber and thereby provide a wider spectral region in which only a single polarization mode predominates.

The above-described single polarization optical fiber, whether or not operating in a wavelength region where one mode is cut off relative to the other, has advantages beyond the construction of a single polarization Fabry-Perot device as described above. Such a single polarization optical fiber is also useful as a polarization retaining fiber for transmission line purposes. The bifringence produced by the above-described optical fiber geometry produces a result that is apparently comparable or superior to the best result that has been reported in literature. Additionally, the aforedescribd optical fiber geometry is more immune to polarization scattering from one state to another state due to external perturbations. Any external pressure applied to this fiber will result largely in a stress along one principal axis of bifringence and accordingly will have little or no tendency to alter the polarization of light polarized along either principal axis. If only one polarization mode exists, the mechanical isolation feature is still useful as it prevents losses resulting from scattering out of the sole polarization mode due to external perturbations.

The modulatable diode assembly illustrated in FIGS. 5, 5c, and 5d and discussed above can serve as an alternate embodiment for the Raman pump beam generators, 10, of FIGS. 1 and 2. To match the lateral output wavelength of each beam generator to a wavelength selective tap as shown in FIG. 3 is possible. In addition, if the wavelength of the generator and the tap drift separately due to environmental changes, mismatch and efficiency problems may develop. It is therefore convenient to let the line tap itself control the laser diode output of the modulatable signal generator described above. Accordingly, a Fabry-Perot resonator is preferably used both as a tap and as a wavelegth tuner. The Fabry-Perot cavity, as discussed above, will have multiple resonant lines, but when used as a Raman amplification pump beam source as represented by the Raman amplifier RA' in FIG. 1, this aspect is advantageous since it is desirable to increase the number of spectral lines in the Raman amplification pump beam to avoid Brillouin backscatter as described hereinabove.

A number of such tap assemblies, as shown in FIG. 1, are placed in series along the length of the trunk to make up a complete Raman beam amplification assembly. By use of lateral coupling, there is no need to compromise the physical integrity of the optical transmission fiber, as is the case with the classic repeaters. A single generator will suffice to effect Raman amplification if it has sufficient power and sufficient number of lines to avoid Brillouin backscatter. A single source, however, is not preferred as it decreases reliability with regard to source failure. Accordingly, providing a plurality of signal generators lowers the sensitivity of the system to individual failures.

Raman amplification pump beam assemblies of the type described above in relationship to FIGS. 5, 5c, 5d and 6 can be conveniently prefabricated at an assembly point on a short section of trunk, and this trunk insert can be spliced into the main trunk line using non-wavelength selective coupling if desired. The insertion of a discrete line interrupts the physical integrity of the optical fiber and injects pump lines in both directions. The bilateral pumping can be overcome by placing a wide band filter tap upstream of the assembly of laser diodes as exemplified by the schematically illustrated wideband filter WBF of FIG. 1. This filter tap, which is laterally coupled to the trunk, should be broad enough to pass all the Raman pump beam laser diode lines, but not the signal channels. The left end of the tap fiber is mirrored so that light travelling to the left is reflected and put back into the line going to the desired direction. The left/right path constitutes another interferometer, but its interaction with the various Fabry-Perot resonators is not harmful in this communication system application.

The total power needed in the Raman amplification pump beam will depend on a number of factors including the core material, core diameter of the trunk line, amount of gain desired, trunk line loss per unit length, and total signal power. The following is a specific example.

EXAMPLE

If the core material is fused silica doped with 10% germania, the peak Raman gain is approximately 50 decibels per kilometer per watt of pump power for a core diameter of 4 microns, operating single mode at cutoff. The gain is proportional to pump power per unit area so long as total signal power is small compared to the pump power, simple exponential gain occurs along the length of the trunk line. If the line loss is one decibel per kilometer, then the effective amplification length is about six kilometers. If 10 decibels of total signal gain is desired, then 1/30 watt of pump power is required. If the total signal amplification exceeds 1/30 watt, then more pump power is required in an amount sufficient to supply the desired signal power.

In selecting signal power level within the system, the minimum level per channel is determined by the criteria described above with regard to photon noise. The maximum level is usually determined by interchannel Raman amplification. If constant amplitude modulation is used, then cross-talk between channels from this effect is negligible although care must be taken to avoid problems which may be encountered in managing signal levels. The shorter wavelength channel will pump longer wavelength channels as described above. This effect can be compensated by shaping the composite Raman gain curve to provide more gain at each Raman amplification RA (or RA') stage through the shorter wavelength channels so the shorter wavelength channels will have energy available to pump the longer wavelength channels to provide a more linear or "equalized" amplification response. In the case where constant amplification modulation is not used, cross-talk will occur between channels and this can be controlled by lowering the signal levels. The maximum level in either case is influenced by the total number of signal channels employed and the spacing between channels. Even if only a small number of channels are used, there is a maximum signal level set by other non-linear optical effects. In addition, the total length enters as a factor. While the maximum signal levels can be determined, it is safe to operate subject to the following limitations.

No more than 1 milliwatt per channel and no more than 100 milliwatts total signal power provided the channel spectrum does not exceed 300 cms.$^{-1}$ (wave number). This assumes constant amplitude modulation in a wavelength between 1 and 1.5 microns. The desired gain per Raman amplification stage is the ratio of the maximum safe signal level to the minimum safe signal level.

Figure 8:
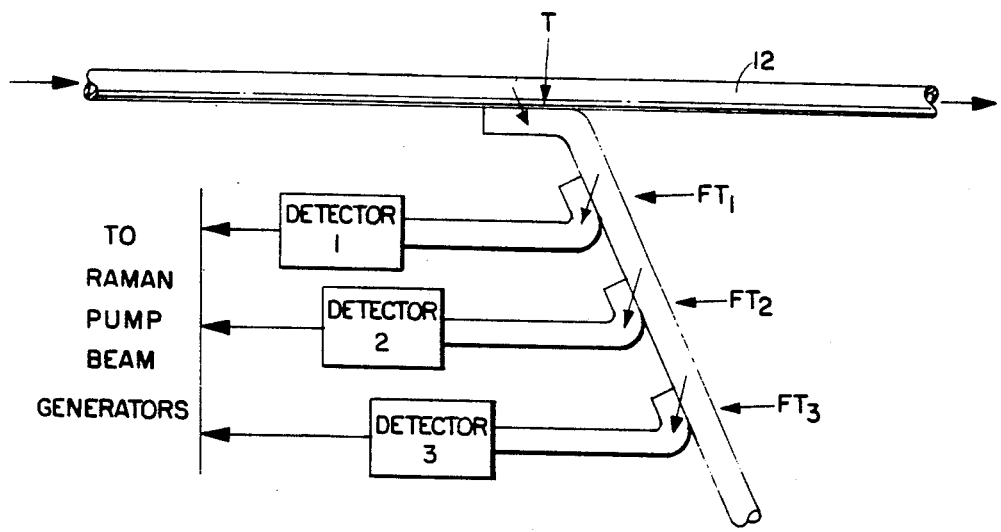
FIG. 8 is a schematic illustration of a signal level detection arrangement for effecting control of the laser diodes of FIG. 3.
Figure 9:
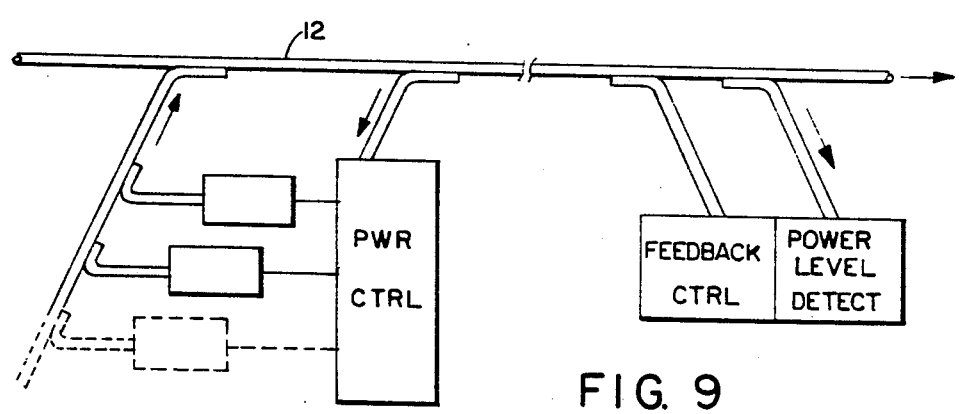
FIG. 9 is an overall system diagram for feeding back amplification signal information to effect control of a preceeding amplifier.

A detector and controller for providing a signal level control consists of a partial tap T (FIG. 8) removing a small fraction of the power from the line 12. The tap T need not necessarily be wavelength selective, although it could be. This may be followed by three filter taps $FT_1$, $FT_2$, and $FT_3$, which are not very narrow. Each filter tap goes to a respective detector $D_1$, $D_2$, and $D_3$, whose output is used as a control to adjust the power inputs to signal the Raman pumps. After several amplification zones, a true feedback signal (FIG. 9) can be taken from the signal channels after amplification and fed back upstream by way of an unused channel to make any additional adjustment to the distribution signal levels. One or more unmodulated signal channels carrying a constant power level interspersed at intervals among the signal channels may be used for baseline information to derive transmitted level information. It is not desirable to use an active signal channel singly for monitoring because the level will depend upon the actual modulation rate at the moment. However, if wavelength shift modulation is used utilizing the wavelength shift modulation signal generator SG described above, the channels can carry a constant level of power regardless of the modulation and can each be used singly or in groups to provide information as to the downstream power level for controlling prior amplification zones.

As can be appreciated by those skilled in the art, various changes and modifications to the present invention may be made without departing from the spirit and scope thereof as defined in the appended claims and their legal equivalent.

What is claimed is:

1. An optical fiber communication system, said system comprising:
   an optical fiber transmission line including a core fabricated of a given material;
   means, coupled to said optical fiber transmission line, for introducing a plurality of information-bearing optical signals thereonto for transmission therealong, each of said information-bearing optical signals being carried in a distinct channel of predetermined wavelength; and
   means coupled to said optical fiber transmission line at a predetermined location, downline of said means for introducing information-bearing optical signals thereonto, for effecting collective optical amplification of all of said information-bearing optical signals, said optical amplification effecting means comprising means for introducing optical energy into said optical fiber transmission line at a plurality of preselected wavelengths relative to the wavelengths of said information-bearing optical signals to collectively amplify all of said information-bearing optical signals by stimulated Raman scattering, said plurality of said preselected wavelengths of said optical energy including an initial wavelength and other wavelengths separated from each other and said initial wavelength wherein adjacent wavelengths thereof are separated in wavenumber by an amount sufficient to minimize the effects of any Brillouin backscattering tending to interfere with said information-bearing optical signals.

2. The system of claim 1 wherein said adjacent wavelengths are separated in wavenumber by an amount equal to or greater than the wavenumber difference corresponding to the region at which Brillouin backscattering occurs for said core material.

3. The system of claim 2 wherein said adjacent wavelengths are separated by at least 1.0 Angstrom.

4. The system of claim 3 wherein said core material comprises fused silica or doped fused silica.

5. The system of claim 2 wherein said optical energy at said initial wavelength and at said other wavelengths is provided by separate sources each having a wavelength corresponding to each of the wavelengths of said additional optical energy.

6. The system of claim 1 wherein said adjacent wavelengths are separated by an amount sufficient to substantially broaden the bandwidth over which said channels can be uniformly amplified whereby more channels than otherwise can be collectively amplified on said system.

7. The system of claim 6 wherein said core material has a characteristic Raman gain curve which varies as a function of the difference in wavenumber between that of said optical energy and the wavenumbers corresponding to said information-bearing optical signals, peaks at a predetermined wavenumber difference between one of the wavelengths of said optical energy and the wavelength of a selected one of said channels carrying said information-bearing optical signals, gradually decreases on either side of said peak gain, and has a range in wavenumber difference that encompasses all of said channels and wherein said adajacent wavelengths of said optical energy are separated by no more than the range of wavenumber difference under said Raman gain curve corresponding to plus or minus 25 percent of said peak gain of said Raman gain curve.

8. The system of claim 1 wherein all of said wavelengths of said optical energy are provided by a single source modulated to operate at all of said wavelengths of said optical energy.

9. An optical fiber communication system, said system comprising:
an optical fiber transmission line including a core fabricated of a given material;
means coupled to said optical fiber transmission line for introducing a plurality of information-bearing optical signals thereonto for transmission therealong, each of said information-bearing optical signals being carried on a distinct channel of predetermined wavelength; and
means laterally coupled to said optical fiber transmission line at a predetermined location, downline of said means for introducing said information-bearing optical signals thereonto, for effecting collective optical amplification of all of said information-bearing optical signals, said amplification effecting means comprising at least one non-rotationally symmetric optical fiber tap for introducing optical energy onto said optical fiber transmission line at a preselected wavelength relative to the wavelengths of said information-bearing optical singals to collectively amplify all of said information-bearing optical signals by stimulated Raman scattering.

10. The system of claim 9 wherein said means for introducing optical energy onto said optical fiber transmission line includes at least one laser diode as an optical energy source.

11. The system of claim 9 where said means for introducing optical energy onto said optical fiber transmission line comprises a first and at least one other laser diode having spectral outputs of different wavelengths.

12. The system of claim 11 further comprising means coupled to said optical fiber transmission line for removing power level information therefrom and coupled to said first and at least one other laser diode for controlling the power level outputs thereof in a manner responsive to the power level information removed from said transmission line.

13. The system of claim 12 wherein said means for controlling the power level output of said first and at least one other laser diode comprises:
means for removing optical energy from the transmission line;
means coupled to said means for removing energy from the transmission line for detecting the level of energy removed therefrom; and
means connected between said detector means and said first and at least one other laser diode to control the power outputs thereof in a manner responsive to the optical energy removed from said transmission line.

14. The system of claim 12 further comprising a wideband filter inserted upline of said means for removing optical energy from said optical fiber transmission line.

15. The system of claim 9 further comprising a first laser diode of given wavelength and a first lateral coupler, said first laser being coupled to said optical fiber tap via said first lateral couple, said system further comprising at least one other laser diode of longer wavelength than that of said first laser diode and at least one other lateral coupler, said at least one other laser diode being laterally coupled to said optical fiber tap via said at least one other lateral coupler.

16. The system of claim 15 wherein said respective lateral couplings of said first and other laser diodes are wavelength selective to prevent optical energy from one of said laser diodes from entering the other of said laser diodes.

17. The system of claim 16 wherein the optical power output of said longer wavelength laser diode is adjusted to compensate for a gain increase caused by Raman amplification effected by the output of said given wavelength laser diode.

18. The system of claim 15 further comprising means coupled to said optical fiber transmission line for removing power level information therefrom, and for conveying a signal representative of said removed power level information through said optical fiber transmission line to said first and at least one other laser diode for controlling the respective power outputs thereof in a manner responsive to the power level information removed from said transmission line.

19. An optical fiber communication system, said system comprising:
an optical fiber transmission line;
means coupled to said optical fiber transmission line for introducing a plurality of information-bearing optical signals thereonto for transmission therealong, each of said information-bearing optical signals being carried on a distinct channel of predetermined wavelength; and
means coupled to said optical fiber transmission line, downline of said means for introducing said information-bearing optical signals thereonto, for effecting collective optical amplification of all of said information-bearing optical signals, said means for effecting optical amplification comprising means for introducing optical energy onto said optical fiber transmission line at a preselected wavelength relative to the wavelengths of said information-bearing optical signals to collectively amplify all of said information-bearing optical signals by stimulated Raman scattering, said means for introducing optical energy into said optical fiber transmission line comprising a gain medium, a Fabry-Perot cavity, and an optical fiber coupling line wherein said gain medium is coupled to said Fabry-Perot cavity via said optical fiber coupling line.

20. The system of claim 19 wherein said coupling line is laterally coupled to said Fabry-Perot cavity.

21. The system of claim 20 wherein said gain medium and Fabry-Perot cavity oscillate to provide an output having multiple wavelengths.

22. An optical fiber communication system, said system comprising:
an optical fiber transmission line;

means coupled to said optical fiber transmission line for introducing a plurality of information-bearing optical signals thereonto for transmission therealong, said means for introducing information-bearing optical signals encoding information in the form of pulses having a given pulse width and wherein each of said information-bearing optical signals is carried on a distinct channel of predetermined wavelength; and means coupled to said optical fiber transmission line, downline of said means for introducing information-bearing optical signals, for effecting collective optical amplification of all of said information-bearing optical signals, said amplification effecting means comprising a plurality of pump sources for introducing optical energy onto said optical fiber transmission line at preselected wavelengths relative to the wavelengths of said information-bearing optical signals to collectively amplify all of said information-bearing optical signals by stimulated Raman scattering, the number of said pump sources being at least equal to the number of photons in an information pulse prior to amplification divided by 20 times the number of electromagnetic states within said given pulse width.

23. An optical fiber communication system, said system comprising:

an optical fiber transmission line;

means coupled to said optical fiber transmission line for introducing a plurality of information-bearing optical signals thereonto for transmission therealong, each of said information-bearing optical signals being carried on a distinct channel of predetermined wavelength, said means for introducing information-bearing optical signals comprising at least one signal generator including:

(a) an elongated gain medium;

(b) means for introducing energy into said gain medium to cause a population inversion of its atomic population such that said gain medium operates to spontaneously emit optical energy of different wavelengths in a random manner characteristic of its material composition; and (c) means external of said gain medium and optically coupled thereto for receiving optical energy therefrom, oscillating said energy at a preselected wavelength and feeding said energy at said preselected wavelength back through said medium for amplification thereby by stimulated emission whereby said signal generator operates to provide as an output a coherent electromagnetic wave at said preselected wavelength, said external means including a resonant fiber cavity structured to oscillate optical energy at said preselected wavelength and being substantially isolated from said gain medium to be relatively insensitive to conditions within said gain medium which would otherwise destabilize the wavelength output of said signal generator, and means coupled to said optical fiber transmission line at a predetermined location, downline of said means for introducing information-bearing optical signals thereonto, for effecting collective optical amplification of all of said information-bearing optical signals.

24. The system of claim 23 wherein said external means includes a mirror on one end of said gain medium.

25. The system of claim 23 wherein said external means includes a transfer fiber segment coupled to one end of said gain medium to receive optical energy therefrom and wherein said resonant fiber cavity is coupled to said transfer fiber segment.

26. The system of claim 25 wherein said resonant fiber cavity is a Fabry-Perot cavity laterally coupled to said transfer fiber segment.

27. The system of claim 26 wherein a portion of said resonant fiber cavity is laterally coupled to said fiber transmission line to transfer said signal generator output thereonto.

28. The system of claim 23 wherein said signal generator includes means for changing the characteristics of said external means to provide said output with at least two distinct wavelength outputs.

29. The system of claim 23 wherein said external means includes means for suppressing unwanted resonant orders of said resonant fiber cavity.

30. The system of claim 29 wherein said means for suppressing unwanted resonant orders comprises a second resonant fiber cavity coupled to said gain medium at an end thereof opposite the end to which said first-mentioned resonant fiber cavity is coupled thereto.

31. The system of claim 23 wherein said external means includes a transfer fiber coupled to one end of said gain medium to receive optical energy therefrom wherein said resonant fiber cavity is coupled to said transfer fiber, a second transfer fiber coupled to the other end of said gain medium to receive optical energy therefrom, and a second resonant fiber cavity coupled to said second transfer fiber.

32. The system of claim 31 wherein both said first and second resonant fiber cavities are Fabry-Perot resonant cavities.

33. The system of claim 32 wherein said first and second resonant fiber cavities are structured so that their frequency responses are coincident at a single dominant wavelength.

34. The system of claim 32 wherein said first resonant fiber cavity includes means for resonating at two desired wavelengths and wherein said second resonant fiber cavity has a finesse such that both of said resonant wavelengths of said first resonant fiber cavity lie within a common resonant line width thereof.

35. The system of claim 23 wherein said signal generator includes means for modulating its output so that said output has at least two distinct wavelengths.

36. The system of claim 35 wherein said modulating means includes a piezoelectric crystal mechanically coupled to said resonant fiber cavity.

37. An optical fiber communication system, said system comprising:

an optical fiber transmission line;

means coupled to said optical fiber transmission line for introducing a plurality of information-bearing optical signals thereonto for transmission therealong, each of said information-bearing optical signals being carried on a distinct channel of predetermined wavelength, said means for introducing information-bearing optical signals comprising at least one signal generator including:

(a) a light gain element including an elongated gain medium having a mirror at one end and means for energizing said gain medium;

(b) a transfer optical fiber coupled to the other end of said gain medium;

(c) an optical fiber Fabry-Perot resonant cavity laterally coupled to said transfer optical fiber and a portion of said optical fiber transmission line, said optical fiber Fabry-Perot resonant cavity being structured and arranged with respect to said transfer fiber and said gain medium to provide feedback to said gain medium via said transfer fiber so that said signal generator lases to provide as an output a coherent electromagnetic wave of predetermined wavelength and bandwidth and wherein said optical fiber Fabry-Perot resonant cavity is structured and arranged with respect to said portion of said fiber transmission line so that said output is coupled onto said fiber transmission line; and means coupled to said optical fiber transmission line at a predetermined location, downline of said information-bearing optical signal introducing means, for effecting collective optical amplification of all of said information-bearing optical signals.

38. An amplifier apparatus for use in an optical fiber transmission system in which a plurality of information-bearing optical signals are each carried on an optical fiber transmission line in a distinct channel of predetermined wavelength and wherein the optical fiber transmission line has a core composed of a given material, said amplifier apparatus comprising:

means adapted to be coupled to said coupled fiber transmission line at a predetermined location, downline of the location at which the information-bearing optical signals are introduced thereonto, for effecting collective optical amplification of all of said information-bearing optical signals, said optical amplification effecting means comprising means for introducing optical energy into said optical fiber transmission line at a plurality of preselected wavelengths relative to the wavelengths of said information-bearing optical signals to collectively amplify all of said information-bearing optical signals, said plurality of said preselected wavelengths of said optical energy including an initial wavelength and other wavelengths separated from each other and said initial wavelength wherein adjacent wavelengths thereof are separated in wavenumber by an amount sufficient to minimize the effects of any Brillouin backscattering tending to interfere with said information-bearing optical signals.

39. The apparatus of claim 38 wherein said adjacent wavelengths are separated in wavenumber by an amount equal to or greater than the wavenumber difference corresponding to the region at which Brillouin backscattering occurs for said core material.

40. The apparatus of claim 39 wherein said adjacent wavelengths are separated by at least 1.0 Angstrom.

41. The apparatus of claim 39 wherein said optical energy at said initial wavelength and at said other wavelengths is provided by separate sources each having a wavelength corresponding to each of the wavelengths of said additional optical energy.

42. The apparatus of claim 40 wherein said core material comprises fused silica or doped fused silica.

43. The apparatus of claim 38 wherein said adjacent wavelengths are separated by an amount sufficient to substantially broaden the bandwidth over which the channels can be uniformly amplified whereby more channels than otherwise can be collectively amplified on the system.

44. The apparatus of claim 43 wherein said core material has a characteristic Raman gain curve which varies as a function of the difference in wavenumber between that of said optical energy and the wavenumbers corresponding to said information-bearing optical signals, peaks at a predetermined wavenumber difference between one of the wavelengths of said optical energy and the wavelength of a selected one of said channels carrying said information-bearing optical signals, gradually decrease on either side of said peak gain, and has a range in wavenumber difference that encompasses all of said channels and wherein said adjacent wavelengths of said optical energy are separated by no more than the range of wavenumber difference under said Raman gain curve corresponding to plus or minus 25 percent of said peak gain of said Raman gain curve.

45. The apparatus of claim 38 wherein all of said wavelengths of said optical energy are provided by a single source modulated to operate at all of said wavelengths of said optical energy.

46. An amplifier apparatus for use in an optical fiber transmission system in which a plurality of information-bearing optical signals are each carried on an optical fiber transmission line on a distinct channel of predetermined wavelength and wherein said optical fiber transmission line includes a core fabricated of a given material, said apparatus comprising:

means laterally coupled to said optical fiber transmission line at a predetermined location, downline of the location where information-bearing optical signals are introduced thereonto, for effecting collective optical amplification of all of said information-bearing optical signals, said amplification effecting means comprising at least one non-rotationally symmetric optical fiber tap for introducing optical energy onto said optical fiber transmission line at a preselected wavelength relative to the wavelengths of said information-bearing optical signals to collectively amplify all of said information-bearing optical signals by stimulated Raman scattering.

47. The apparatus of claim 46 wherein said means for introducing optical energy onto said optical fiber transmission line includes at least one laser diode as an optical energy source.

48. The apparatus of claim 46 where said means for introducing optical energy onto said optical fiber transmission line comprises a first and at least one other laser diode having spectral outputs of different wavelengths.

49. The apparatus of claim 48 further comprising means structured for coupling to the optical fiber transmission line for removing power level information therefrom and coupled to said first and at least one other laser diode for controlling the power level outputs thereof in a manner responsive to the power level information removed from the optical fiber transmission line.

50. The apparatus of claim 49 wherein said means for controlling the power level outputs of said first and at least one other laser diode comprises:

means structured for removing optical energy from the transmission line;

means coupled to said means for removing energy from the transmission line for detecting the level of energy removed therefrom; and means connected between said detector means and said first and at least one other laser diode to control the power outputs thereof in a manner responsive to the optical energy removed from the transmission line.

51. The apparatus of claim 49 further comprising a wideband filter structured for insertion upline of said means for removing optical energy from the optical fiber transmission line.

52. The apparatus of claim 46 further comprising a first laser diode of given wavelength and a first lateral coupler, said first laser diode being coupled to said optical fiber tap via said first lateral couple, said apparatus further comprising at least one other laser diode of longer wavelength than that of said first laser diode and at least one other lateral coupler, said at least one other laser diode being laterally coupled to said optical fiber tap via said at least one other lateral coupler.

53. The apparatus of claim 52 wherein said respective lateral couplings of said first and other laser diodes are wavelength selective to prevent optical energy from one of said laser diodes from entering the other of said laser diodes.

54. The apparatus of claim 53 wherein the optical power output of said longer wavelength laser diode is adjusted to compensate for a gain increase caused by Raman amplification effected by the output of said given wavelength laser diode.

55. The apparatus of claim 52 further comprising means structured for coupling to the optical fiber transmission line for removing power level information therefrom, and for conveying a signal representative of said removed power level information through the optical fiber transmission line to said first and at least one other laser diode for controlling the respective power outputs thereof in a manner responsive to the power level information removed from the optical fiber transmission line.

56. An amplifier apparatus for use in an optical fiber transmission system in which a pluraltiy of information-bearing optical signals are each carried on an optical fiber transmission line on a distinct channel of predetermined wavelength and wherein said optical fiber transmission line includes a core fabricated of a given material, said apparatus comprising:
    means optically coupled to said optical fiber transmission line, downline of the location where said information-bearing optical signals are introduced thereonto, for effecting collective optical amplification of all of said information-bearing optical signals, said means for effecting optical amplification comprising means for introducing optical energy onto said optical fiber transmission line at a preselected wavelength relative to the wavelengths of said information-bearing optical signals to collectively amplify all of said information-bearing optical signals by stimulated Raman scattering, said means for introducing optical energy into said optical fiber transmission line comprising a gain medium, a Fabry-Perot cavity, and an optical fiber coupling line wherein said gain medium is coupled to said Fabry-Perot cavity via said optical fiber coupling line.

57. The apparatus of claim 56 wherein said coupling line is laterally coupled to said Fabry-Perot cavity.

58. The apparatus of claim 57 wherein said gain medium and said Fabry-Perot cavity oscillate to provide an output having multiple wavelengths.

59. An amplifier apparatus for use in an optical fiber transmission system in which a plurality of information-bearing optical signals are each carried in an optical fiber transmission line in a distinct channel of predetermined wavelength and wherein the information contained in said signals is encoded therein in the form of pulses having a given pulse width, said apparatus comprising:
    means optically coupled to said optical fiber transmission line, downline of the location where the information-bearing optical signals are introduced thereonto, for effecting collective optical amplification of all of said information-bearing optical signals, said amplification effecting means comprising a plurality of pump sources for introducing optical energy onto said optical fiber transmission line at preselected wavelengths relative to the wavelengths of said information-bearing optical signals to collectively amplify all of said information-bearing optical signals by stimulated Raman scattering, the number of said pump sources being at least equal to the number of photons in an information pulse prior to amplification divided by 20 times the number of electromagnetic states within said given pulse width.

60. An optical signal generator comprising:
    (a) an elongated gain medium;
    (b) means for introducing energy into said gain medium to cause a population inversion of its atomic population such that said gain medium operates to spontaneously emit optical energy of different wavelengths in a random manner characteristic of its material composition; and
    (c) means external of said gain medium and optically coupled thereto for receiving optical energy therefrom, oscillating said energy at a preselected wavelength and feeding said energy at said preselected wavelength back through said medium for amplification thereby by stimulated emission whereby said signal generator operates to provide as an output a coherent electromagnetic wave at said preselected wavelength, said external means including a resonant fiber cavity structured to oscillate optical energy at said preselected wavelength and being substantially isolated from said gain medium to be relatively insensitive to conditions within said gain medium which would otherwise destabilize the wavelength output of said signal generator, said external means further including a transfer fiber segment coupled to one end of said gain medium to receive optical energy therefrom and wherein said resonant fiber cavity is laterally coupled to said transfer fiber segment.

61. The signal generator of claim 60 wherein said resonant fiber cavity is a Fabry-Perot cavity laterally coupled to said transfer fiber segment.

62. The signal generator of claim 61 wherein a portion of said resonant fiber cavity is adapted to be laterally coupled to a fiber transmission line to transfer said signal generator output thereonto.

63. An optical signal generator comprising:
    (a) an elongated gain medium;
    (b) means for introducing energy into said gain medium to cause a population inversion of its atomic population such that said gain medium operates to spontaneously emit optical energy of different wavelengths in a random manner characteristic of its material composition; and
    (c) means external of said gain medium and optically coupled thereto for receiving optical energy therefrom, oscillating said energy at a preselected wavelength and feeding said energy at said preselected wavelength back through said medium for amplification thereby by stimulated emission whereby said signal generator operates to provide as an output a coherent electromagnetic wave at said preselected wavelength, said external means including a resonant fiber cavity structured to oscillate optical energy at said preselected wavelength and being substantially isolated from said gain medium to be relatively insensitive to conditions within said gain medium which would otherwise destabilize the wavelength output of said signal generator, said external means further including a transfer fiber coupled to one end of said gain medium to receive optical energy therefrom wherein said resonant fiber cavity is coupled to said transfer fiber, a second transfer fiber coupled to the other end of said gain medium to receive optical energy therefrom, and a second resonant fiber cavity coupled to said second transfer fiber.

64. The signal generator of claim 63 wherein both said first and second resonant fiber cavities are Fabry-Perot resonant cavities.

65. The signal generator of claim 64 wherein said first and second resonant fiber cavities are structured so that their frequency responses are coincident at a single dominant wavelength.

66. The signal generator of claim 64 wherein said first resonant fiber cavity includes means for resonating at two desired wavelengths and wherein said second resonant fiber cavity has a finesse such that both of said resonant wavelengths of said first resonant fiber cavity lie within a common resonant line width thereof.

67. An optical signal generator comprising:
(a) an elongated gain medium;
(b) means for introducing energy into said gain medium to cause a population inversion of its atomic population such that said gain medium operates to spontaneously emit optical energy of different wavelengths in a random manner characteristic of its material composition; and
(c) means external of said gain medium and optically coupled thereto for receiving optical energy therefrom, oscillating said energy at a preselected wavelength and feeding said energy at said preselected wavelength back through said medium for amplification thereby by stimulated emission whereby said signal generator operates to provide as an output a coherent electromagnetic wave at said preselected wavelength said external means including a resonant fiber cavity structured to oscillate optical energy at said preselected wavelength and being substantially isolated from said gain medium to be relatively insensitive to conditions within said gain medium which would otherwise destabilize the wavelength output of said signal generator, and means for modulating output of said signal generator so that said output has at least two distinct wavelengths, said modulating means including a piezoelectric crystal mechanically coupled to said resonant fiber cavity.

68. An optical signal generator for use with an optical fiber transmission line, said signal generator comprising:
(a) a light gain element including an elongated gain medium having a mirror at one end and means for energizing said gain medium;
(b) a transfer optical fiber coupled to the other end of said gain medium; and (c) an optical fiber Fabry-Perot resonant cavity laterally coupled to said transfer optical fiber and structured for coupling with a portion of an optical fiber transmission line, said optical Fabry-Perot resonant cavity fiber being structured and arranged with respect to said transfer fiber and said gain medium to provide feedback to said gain medium via said transfer fiber so that said signal generator lases to provide as an output a coherent electromagnetic wave of predetermined wavelength and bandwidth and wherein said optical fiber Fabry-Perot resonant cavity is structured and arranged to be coupled to a portion of the fiber transmission line to introduce said output onto said fiber transmission line.

69. A single mode optical fiber for use in optical fiber communication system, said optical fiber comprising:
a core composed of an optically transparent material of given index of refraction and having a predetermined thermal coefficient of expansion; and
a cladding formed of a material of lower index than that of said core material, said cladding material being bound to said core only partially about the circumference of said core such that a pair of spaced apart air cavities are formed on opposite portions of said core between said unbound portions of said core and said cladding, said cladding material having a coefficient of thermal expansion different from that of said core so that said cladding exerts a permanent birefringent stress on said core along a principal axis through said core and said cladding whereby said core propagates only one polarization mode parallel to said axis, said core, said cladding, and said cavities being all generally rectangular in cross-sectional shape and wherein said core is offset to one side of the geometric center of said cladding in one direction and centered in said cladding in a direction perpendicular to said one direction to provide said optical fiber with a non-rotationally symmetric geometry to enhance lateral coupling.

70. An optical fiber communications system comprising multiple channel signal generation means operative to encode information in the form of optical pulses having a given pulse width; a single mode optical fiber transmission line coupled to said signal generation means; and one or more Raman amplifier means located along said transmission line wherein the number of Raman amplifier means is at least equal to the number of photons in a pulse divided by 20 times the number of states for said pulse width.

71. The system of claim 70 wherein said Raman amplifier means comprise means for producing a pump beam and means for combining said pump beam with a signal beam along a common path.

72. An optical fiber communications system comprising multiple channel signal generation means; a single mode fiber optical transmission line coupled to said signal generation means; and one or more Raman amplifier means located along said optical fiber transmission line wherein each amplifier means comprises a laser diode having two separate spectral line outputs which form a pump beam having multiple spectral characteristics and wherein each amplifier means includes means for combining pump beams thereof with a signal beam as it travels down a common path of said optical fiber transmission line, said means for combining each of said pump beams with said signal beam comprising a non-rotationally symmetric fiber coupled to a respective one of said laser diodes and laterally coupled with a selected portion of said optical fiber transmission line.

73. An optical fiber communications system comprising multiple channel signal generation means; a single mode optical fiber transmission line coupled to said signal generation means; and one or more Raman amplifier means located along said optical fiber transmission line, said signal generation means comprising a laser diode coupled to a Fabry-Perot modulator and including means for unwanted resonant order suppression of said Fabry-Perot modulator wherein said suppression means comprises a second Fabry-Perot device coupled to said laser diode of said signal generation means.

74. The system of claim 73 wherein said Raman amplifier means comprise means for producing a pump beam and means for combining said pump beam with a signal beam along a common path.

75. The system of claim 74 wherein said means for combining said pump beam and signal beam comprises a portion of said transmission line.

76. The system of claim 74 wherein said means for combining said pump beam with said signal beam includes means for laterally coupling said pump beam onto said transmission line.

77. An optical fiber communications system comprising multiple channel signal generation means; a single mode fiber transmission line coupled to said signal generation means; and one or more Raman amplifier means located along said transmission line wherein said signal generation means comprises a laser diode coupled to first and second Fabry-Perot modulator devices and is a pulse wavelength shift generator, said second Fabry-Perot device having a wider resonant line structure than that of said first Fabry-Perot device to allow resonance of the generator to be obtained with respect to only one order of wavelength common to both Fabry-Perot devices.

78. The system of claim 77 wherein said first Fabry-Perot device includes means for producing an output at two desired wavelengths and said second Fabry-Perot device has a finesse such that both said wavelengths lie within a common resonant line width.

79. The system of claim 78 wherein said Raman amplifier means comprise means for producing a pump beam and means for combining said pump beam with a signal beam along a common path.

80. The system of claim 79 wherein said means for combining said pump beam and signal beam comprises a portion of said transmission line.

81. The system of claim 79 wherein said means for combining said pump beam with said signal beam includes means for laterally coupling said pump beam onto said transmission line.

82. An optical fiber communications system comprising multiple channel signal generation means; a single mode optical fiber transmission line coupled to said signal generation means; and one or more Raman amplifier means located along said transmission line and wherein said signal generation means comprises a laser diode coupled to first and second Fabry-Perot modulator devices and is an amplitude modulated pulse generator, said second Fabry-Perot device having a wider resonant line structure than that of said first Fabry-Perot device to allow only one order of wavelength common to both Fabry-Perot devices, said first Fabry-Perot device including means for producing an output at two desired wavelengths, said second Fabry-Perot device having a finesse such that both said wavelengths lie within a common resonant linewidth, and a third Fabry-Perot device coupled to said first Fabry-Perot device for filtering out one of said two desired wavelengths.

83. The system of claim 82 wherein said Raman amplifier means comprise means for producing a pump beam and means for combining said pump beam with a signal beam along a common path.

84. The system of claim 83 wherein said means for combining said pump beam and signal beam comprises a portion of said transmission line.

85. The system of claim 83 wherein said means for combining said pump beam with said signal beam includes means for laterally coupling said pump beam onto said transmission line.

86. An optical fiber communications system comprising multiple channel signal generation means; a single mode fiber transmission line coupled to said signal generation means; and one or more Raman amplifier means located along said transmission line and wherein said Raman amplifiers comprise a laser diode and said signal generation means comprises means for generating a double line and modulator means for said line generator wherein said double line generator includes a Fabry-Perot device.

87. The system of claim 86 wherein said double line generator comprises means for modulating said laser diode at a wavelength equal to one-half the wavelength shift desired and said Fabry-Perot device has a split resonant line characteristic.

88. The system of claim 86 wherein said Fabry-Perot device has non-split resonant lines and said double line generator comprises means for modulating said Fabry-Perot device with a sine wave of a frequency equal to one-half the wavelength shift required.

89. The system of claim 86 wherein said modulator means comprises a piezoelectric cyrstal.

90. The system of claim 86 wherein said Raman amplifier means comprise means for producing a pump beam and means for combining said pump beam with a signal beam along a common path.

91. The system of claim 90 wherein said means for combining said pump beam and signal beam comprises a portion of said transmission line.

92. The system of claim 90 wherein said means for combining said pump beam with said signal beam includes means for laterally coupling said pump beam onto said transmission line.

93. An optical fiber communications system comprising multiple channel signal generation means; a single mode fiber transmission line coupled to said signal generation means; and one or more Raman amplifier means located along said transmission line and wherein said signal generation means comprises a laser diode coupled to a Fabry-Perot modulator and includes means for unwanted resonant order suppression comprising a single mode modulator.

94. The system of claim 93 wherein said single mode modulator comprises a Fabry-Perot device comprising a single mode fiber optic core and cladding bound to said core only partially about the circumference of said core such that a cavity is formed between a portion of said core and said cladding, and a piezoelectric crystal mounted to said cladding.

95. The system of claim 93 wherein said Raman amplifier means comprise means for producing a pump beam and means for combining said pump beam with a signal beam along a common path.

96. The system of claim 95 wherein said means for combining said pump beam and signal beam comprises a portion of said transmission line.

97. The system of claim 95 wherein said means for combining said pump beam with said signal beam includes means for laterally coupling said pump beam onto said transmission line.

* * * * *